United States Patent
Li

(10) Patent No.: US 8,566,665 B2
(45) Date of Patent: *Oct. 22, 2013

(54) SYSTEMS AND METHODS FOR ERROR CORRECTION USING LOW DENSITY PARITY CHECK CODES USING MULTIPLE LAYER CHECK EQUATIONS

(75) Inventor: Zongwang Li, San Jose, CA (US)

(73) Assignee: LSI Corporation, San Jose, CA (US)

( * ) Notice: Subject to any disclaimer, the term of this patent is extended or adjusted under 35 U.S.C. 154(b) by 185 days.

This patent is subject to a terminal disclaimer.

(21) Appl. No.: 13/167,775

(22) Filed: Jun. 24, 2011

(65) Prior Publication Data
US 2012/0331369 A1 Dec. 27, 2012

(51) Int. Cl.
*H03M 13/00* (2006.01)
*G06F 11/00* (2006.01)

(52) U.S. Cl.
USPC ............................................ 714/758; 714/701

(58) Field of Classification Search
USPC .......... 714/701, 746, 752, 758, 799, 800, 699
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama et al. | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Christine Tu
(74) *Attorney, Agent, or Firm* — Hamilton DeSanctis & Cha (LSI)

(57) ABSTRACT

Various embodiments of the present invention provide systems and methods for generating a code format. One method discussed includes: receiving a first matrix having a row width and a column height that is greater than one; incorporating a circulant into a first column of the first matrix; testing the first column for trapping sets, wherein at least one trapping set is identified; selecting a value to mitigate the identified trapping set; and augmenting the first matrix with a second matrix to yield a composite matrix. The second matrix has the selected value in the first column, and wherein the identified trapping set is mitigated.

22 Claims, 18 Drawing Sheets

(56) References Cited

U.S. PATENT DOCUMENTS

| | | | |
|---|---|---|---|
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 5,317,472 A1 | 6/2001 | Choi et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Katawani et al. | |
| 6,748,034 B2 | 6/2004 | Hattori et al. | |
| 6,757,862 B1 | 6/2004 | Marianetti, II | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greeberg et al. | |
| 7,093,179 B2 | 8/2006 | Shea | |
| 7,113,356 B1 | 9/2006 | Wu | |
| 7,136,244 B1 | 11/2006 | Rothbert | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghavan et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,370,258 B2 | 5/2008 | Iancu et al. | |
| 7,403,752 B2 | 7/2008 | Raghavan et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,509,927 B2 | 9/2009 | Shin | |
| 7,587,657 B2 | 9/2009 | Haratsch | |
| 7,590,168 B2 | 9/2009 | Raghavan et al. | |
| 7,702,989 B2 | 4/2010 | Graef et al. | |
| 7,712,008 B2 | 5/2010 | Song et al. | |
| 7,738,330 B2 | 6/2010 | Jin et al. | |
| 7,752,523 B1 * | 7/2010 | Chaichanavong et al. | 714/755 |
| 7,801,200 B2 | 9/2010 | Tan | |
| 7,802,163 B2 | 9/2010 | Tan | |
| 2003/0063405 A1 | 4/2003 | Jin et al. | |
| 2003/0081693 A1 | 5/2003 | Raghavan et al. | |
| 2003/0087634 A1 | 5/2003 | Raghavan et al. | |
| 2003/0112896 A1 | 6/2003 | Raghavan et al. | |
| 2003/0134607 A1 | 7/2003 | Raghavan et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0078399 A1 | 4/2005 | Fung | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0210002 A1 | 9/2006 | Yang et al. | |
| 2006/0248435 A1 | 11/2006 | Haratsch | |
| 2006/0256670 A1 | 11/2006 | Park et al. | |
| 2007/0011569 A1 | 1/2007 | Vila Casado et al. | |
| 2007/0047121 A1 | 3/2007 | Elefeheriou et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2009/0185643 A1 | 7/2009 | Fitzpatrick | |
| 2009/0199071 A1 | 8/2009 | Graef | |
| 2009/0235116 A1 | 9/2009 | Tan et al. | |
| 2009/0235146 A1 | 9/2009 | Tan et al. | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghavan et al. | |
| 2010/0042877 A1 | 2/2010 | Tan | |
| 2010/0042890 A1 | 2/2010 | Gunam | |
| 2010/0050043 A1 | 2/2010 | Savin | |
| 2010/0061492 A1 | 3/2010 | Noeldner | |
| 2010/0070837 A1 | 3/2010 | Xu et al. | |
| 2010/0164764 A1 | 7/2010 | Nayak | |
| 2010/0185914 A1 | 7/2010 | Tan et al. | |
| 2011/0075569 A1 | 3/2011 | Marrow et al. | |
| 2011/0080211 A1 | 4/2011 | Yang et al. | |
| 2011/0167246 A1 | 7/2011 | Yang et al. | |
| 2012/0089883 A1 * | 4/2012 | Li et al. | 714/752 |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.

(56) References Cited

OTHER PUBLICATIONS

U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System Architectures: Synergies with Solid-State Disks" Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note.
K. Gunnam et al., "Value-Reuse Properties of Min-Sum for GF(q)"(dated Jul. 2008) Dept. of ECE, Texas A&M University Technical Note.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth, May 2010.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE International Conference on Communication pp. 1977-1981, May 2008.
Xia et al, "Reliability-based Reed-Solomon decoding for magnetic recording channels", IEEE Transactions on Magnetics, vol. 42, pp. 2603-2605, Oct. 2006
Yeo et al., "VLSI Architecture for Iterative Decoders in Magnetic Recording Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matrix in Irreg. LDPC Codes for 10-Gb/s Opt. Signls" Jrnl of Lightwave Tech., vol. 23, Sep. 2005.
Zhong et al., "Area-Efficient Min-Sum Decoder Design for High-Rate QC-LDPC Codes in Magnetic Recording", pp. 1-6.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

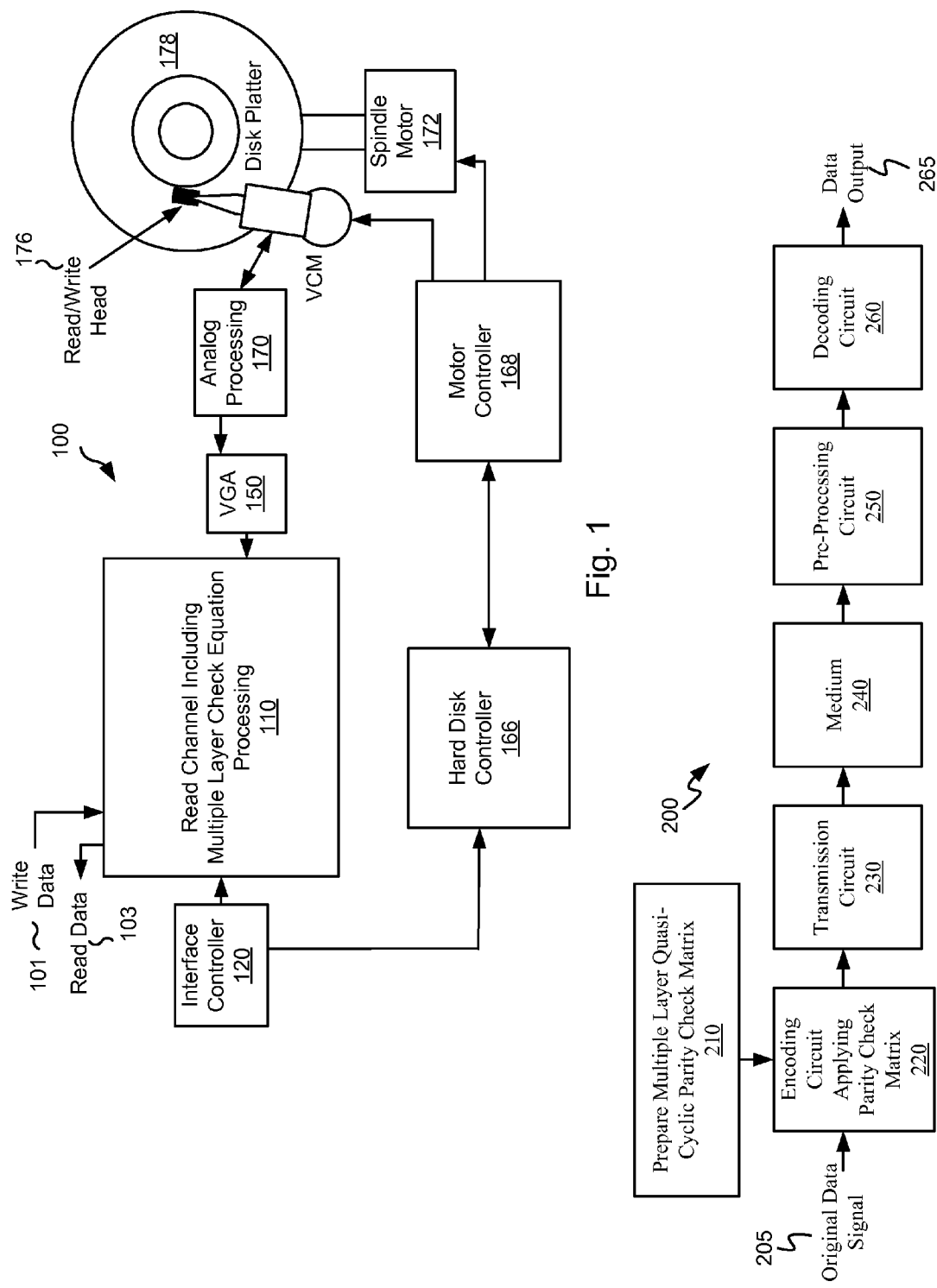

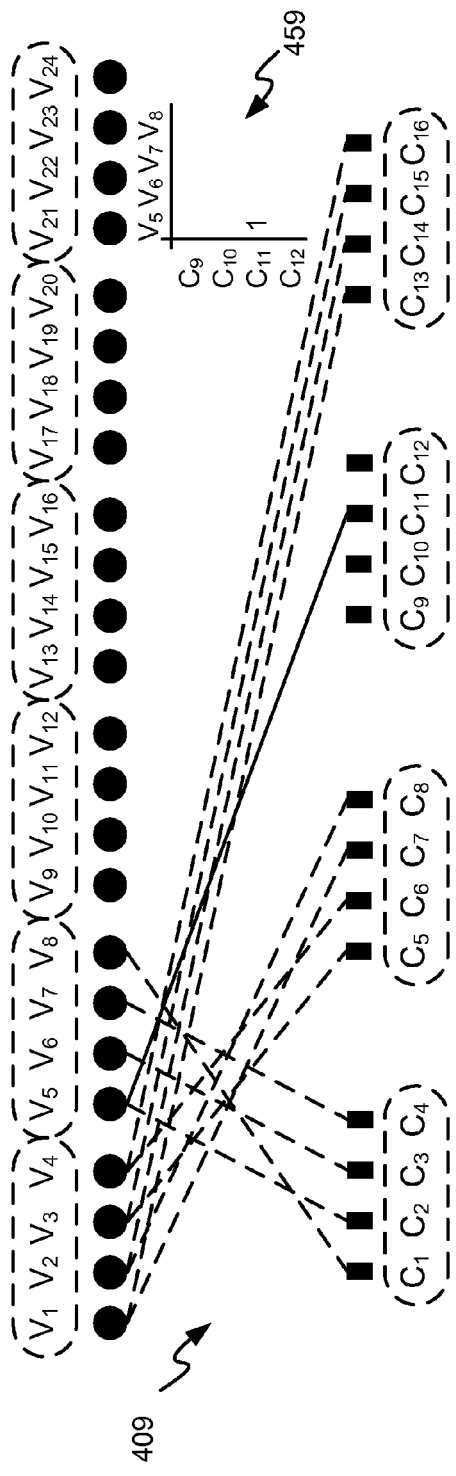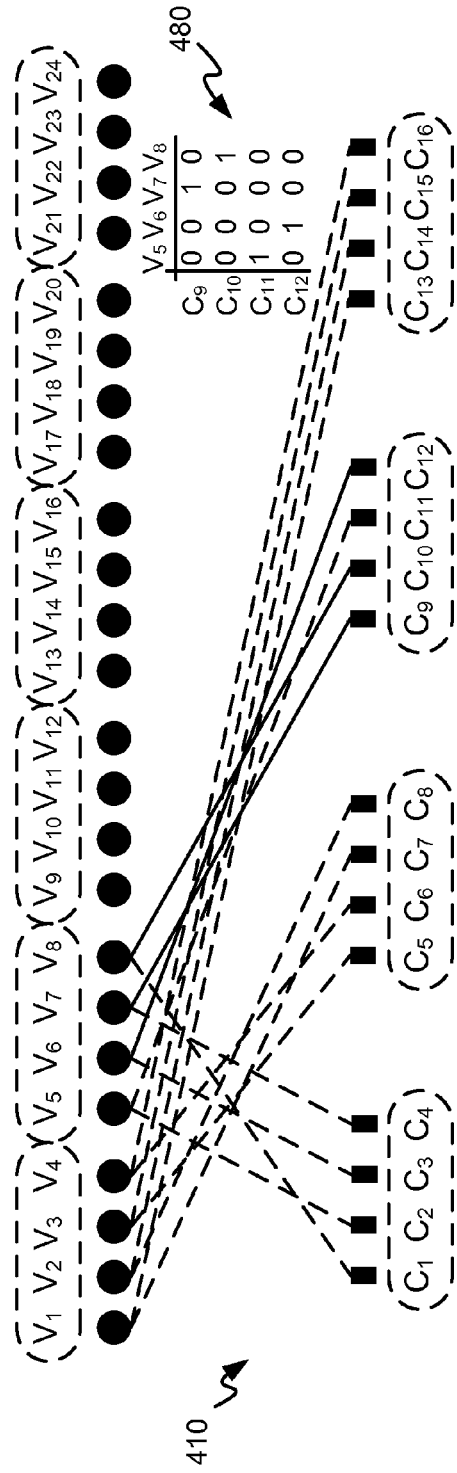
Fig. 4i
Fig. 4j

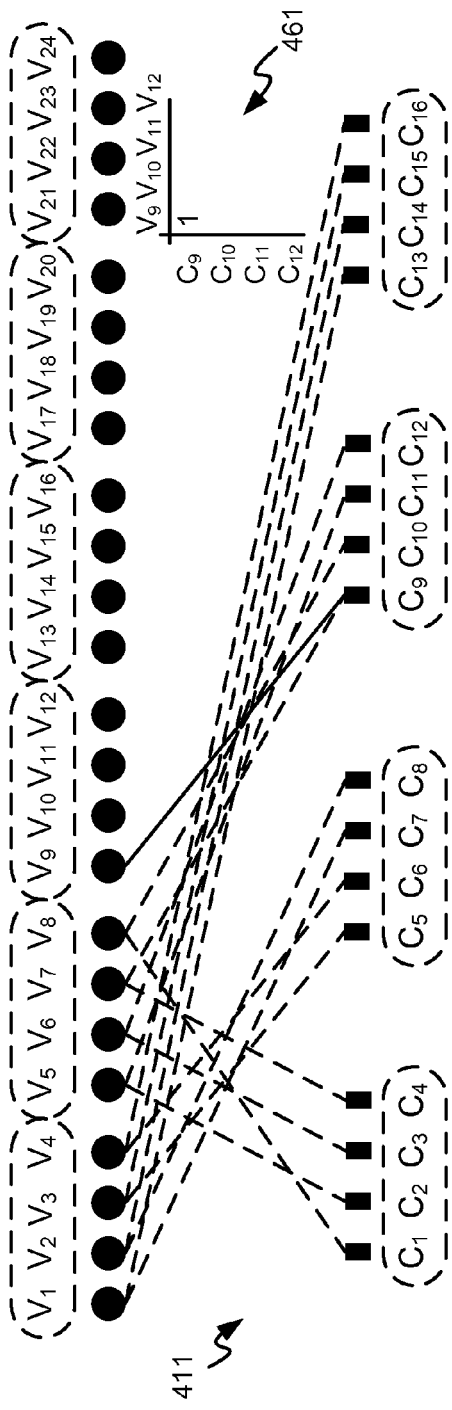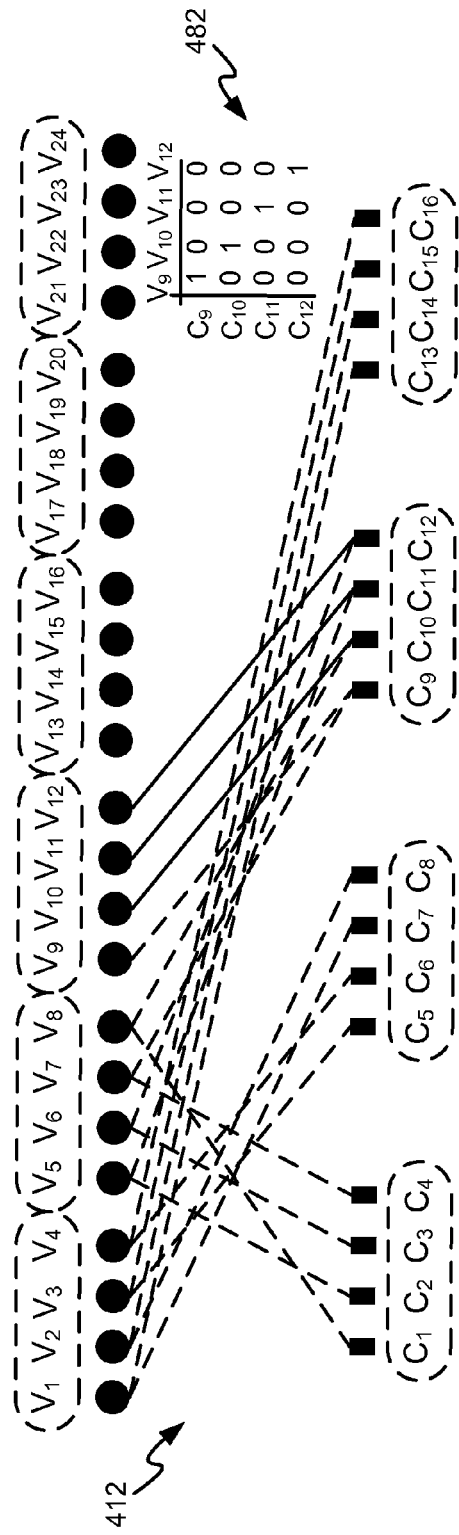
Fig. 4k
Fig. 4l

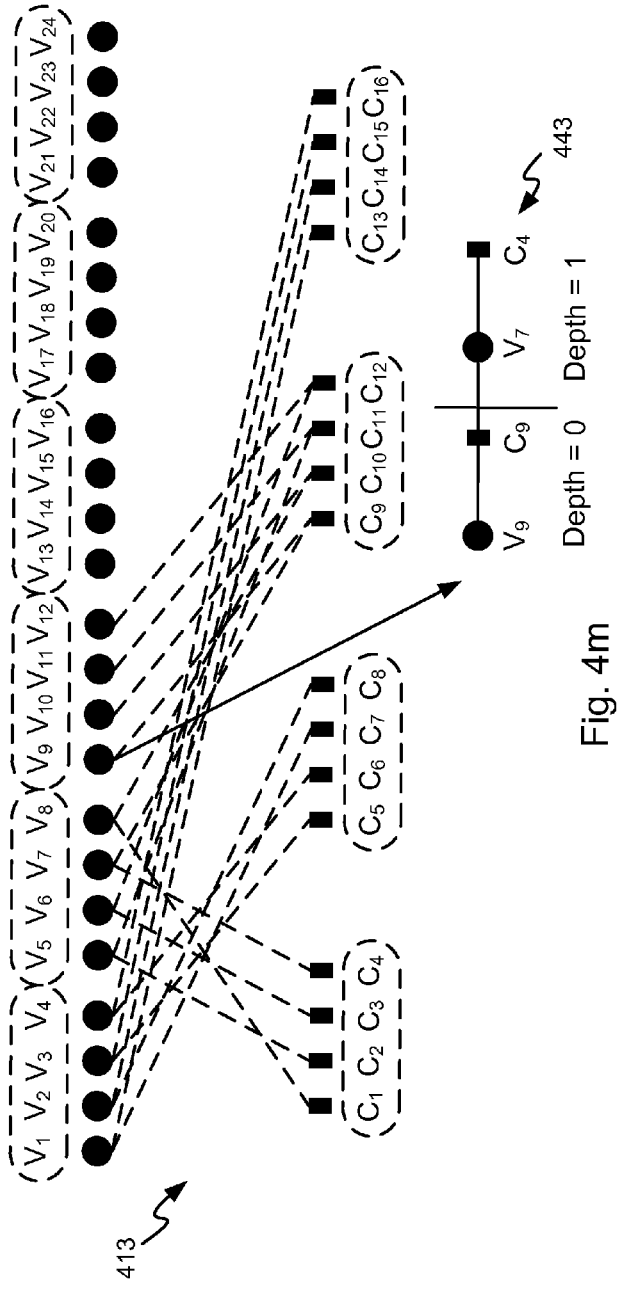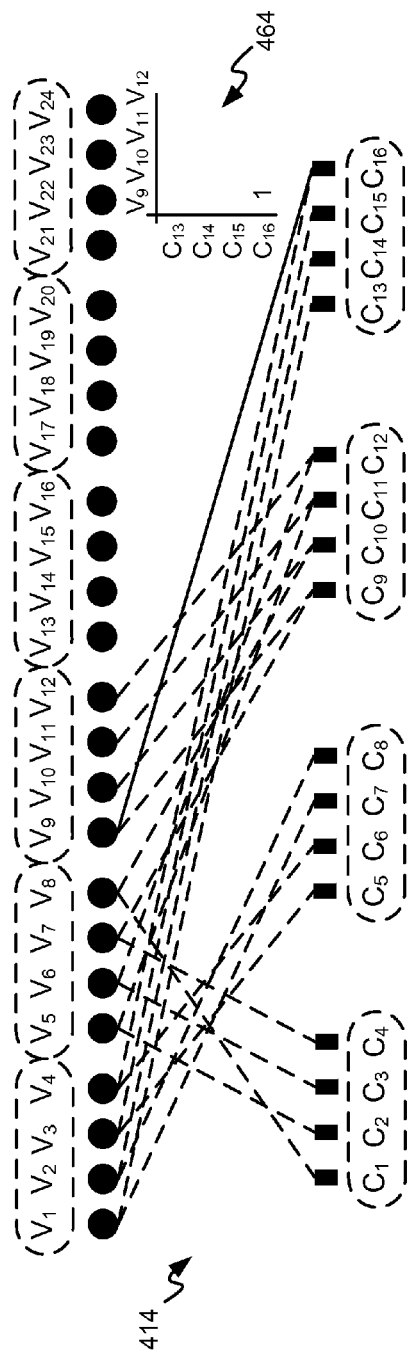

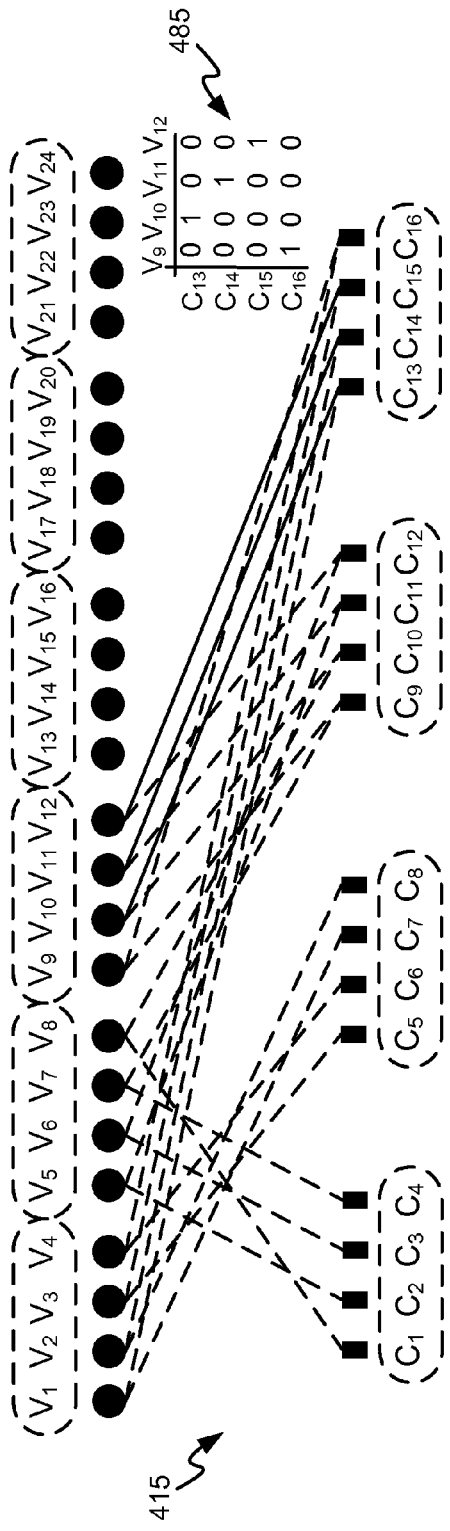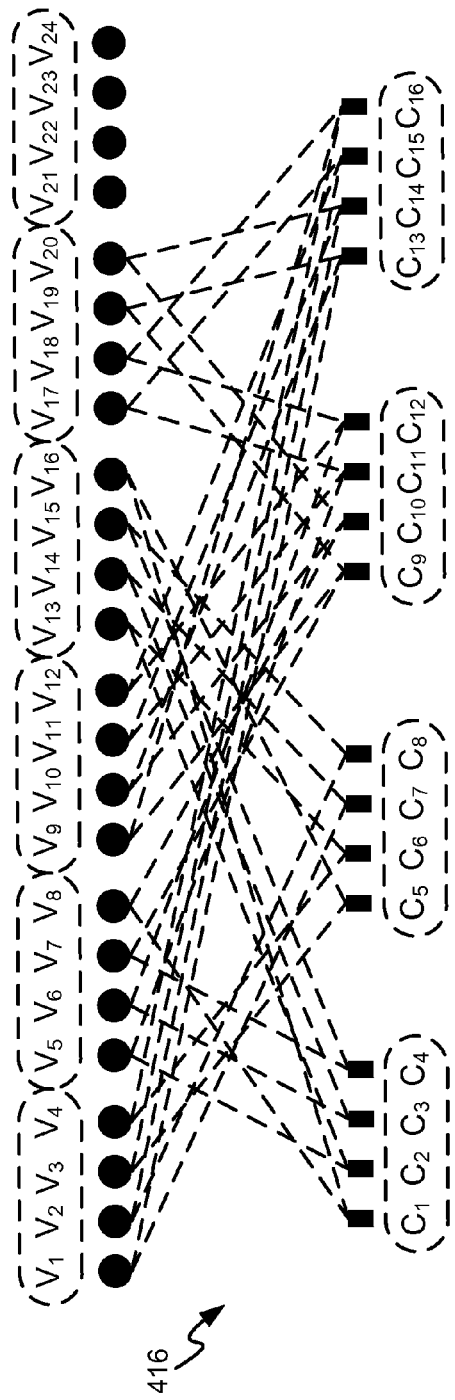
Fig. 4o
Fig. 4p $$H_1 = \begin{bmatrix} P_{1,1} & P_{1,j_1} & & P_{1,j} & \\ 0 & P_{2,j_2} & \cdots & 0 & P_{2,j_2+1} & \cdots & 0 \\ \vdots & \vdots & \ddots & \vdots & \vdots & \ddots & \vdots \\ 0 & P_{2,1} & & 0 & & & 0 \end{bmatrix}$$

$$H_2 = \begin{bmatrix} R_{1,1} & R_{1,3} & & R_{2,3} & \cdots & R_{2,3L/2} \\ 0 & 0 & & & & \\ \vdots & \vdots & & \vdots & & \vdots \\ R_{2,1} & & & & & \end{bmatrix}$$

$$H_3 = \begin{bmatrix} R_{3,1} \\ R_{3,2} \\ \vdots \\ R_{3,5} \\ R_{3,6} \\ \vdots \\ R_{3,L} \end{bmatrix}$$

700, 703, 705

$$R_J = \begin{bmatrix} 0_{(p-p1) \times p} \\ q^{J+0}_{p1 \times p1} & q^{J+1}_{p1 \times p1} & \cdots & q^{J+k}_{p1 \times p1} \end{bmatrix}$$

710

$$q = \begin{bmatrix} 0 & 0 & \cdots & 0 & 1 \\ 0 & 0 & \cdots & 0 & 1 & 0 \\ \vdots & \vdots & & \vdots & \vdots & \vdots \\ 1 & 0 & \cdots & 0 & 0 & 0 \\ 0 & 1 & \cdots & 0 & 0 & 0 \end{bmatrix}$$

SYSTEMS AND METHODS FOR ERROR CORRECTION USING LOW DENSITY PARITY CHECK CODES USING MULTIPLE LAYER CHECK EQUATIONS

BACKGROUND OF THE INVENTION

The present inventions are related to systems and methods for data processing, and more particularly to low density parity check (LDPC) based data processing.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In such systems, errors are introduced to the data during the transmission and recovery processes. In some cases, such errors can be detected by applying encoding/decoding techniques such as low density parity check encoding/decoding. In some cases such encoding/decoding techniques may require complex and power intense functionality. Further, in some cases, errors may be introduced by the encoding/decoding techniques in the form of trapping sets.

Hence, there exists a need in the art for advanced systems and methods for error correction in data processing systems.

BRIEF SUMMARY OF THE INVENTION

The present inventions are related to systems and methods for data processing, and more particularly to LDPC based data processing.

Various embodiments of the present invention provide methods for generating a code format. The methods include: receiving a first matrix having a given row width, and receiving a second matrix having the same given row width. The first matrix exhibits a low row weight, and the second matrix exhibits a medium row weight. Circulants are incorporated into a combination of the first matrix and the second matrix. The columns include at least one element from the first matrix and at least one element from the second row. The method further includes: column circulants for local girth (shortest cycle in the current matrix) and trapping sets; selecting a shift values of current column circulants to mitigate the identified trapping sets and increased local girth; and augmenting the combination of the first matrix and the second matrix with a third matrix to yield a composite matrix. The third matrix has the selected shift values in its circulants, and the identified trapping sets are mitigated.

In some cases of the aforementioned embodiments, the third matrix has different circulant size. In various cases, the row weight of the third matrix is high. In particular cases, the combination of the first matrix and the second matrix has a first column height, and the third matrix has a second column height. In one particular case, the second column height is equal to one. In some cases, the circulant is a first circulant, and the value is a second circulant.

Testing the first column for local girth and trapping sets yields a local girth and some trapping sets. In such cases, the methods may further include: if the local girth is smaller than the pre-defined value and the quality of trapping sets does not meet the pre-defined requirement, change the shift value of circulants of the first column; re-testing the first column for trapping sets, where new trapping sets and local girth are identified; and selecting circulants for inclusion in the first column based at least in part on the circulants which give the shortest local girth and best trapping sets criteria. In some cases, selecting the shift value of circulants to mitigate the identified trapping set includes: selecting a set of shift value for circulants of current column; testing the composite matrix for trapping sets such that local girth and a first number of trapping sets are identified; selecting a second set of shift values for circulants of current column; re-testing the composite matrix for trapping sets such that local girth and a second number of trapping sets are identified; and selecting one of the first set of shift values and second set of shift values for the circulants of the based on a comparison of the first number of trapping sets and local girth and the second number of trapping sets and local girth.

Other embodiments of the present invention provide systems for generating a code format. The systems include a computer readable medium having instructions executable by a processor. The instructions are executable to: receive a first matrix having a given row width, and receive a second matrix having the given row width. The first matrix exhibits a low row weight, and the second matrix exhibits a medium row weight. The instructions are further executable to incorporate a circulant into a first column of a combination of the first matrix and the second matrix. The first column includes at least one element from the first matrix and at least one element from the second matrix. In addition, the instructions are further executable to: test the first column for trapping sets and local girth, where a local girth and maybe some number of trapping sets are identified; select a set of shift value for circulants in the first column to mitigate the identified trapping sets and local girth; and augment the combination of the first matrix and the second matrix with a third matrix to yield a composite matrix. The third matrix has the selected shift value in its circulants, and the identified trapping sets are further mitigated.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 shows a storage system including a read channel module having multiple layer check equation processing in accordance with one or more embodiments of the present invention;

FIG. 2 depicts a data is a data processing system relying on multiple layer quasi cyclic parity check decoding in accordance with various embodiments of the present invention;

FIG. 7 show an LDPC code structure including three different density of codes that may be used in relation to one or more embodiments of the present invention;

DETAILED DESCRIPTION OF THE INVENTION

Figure 3:
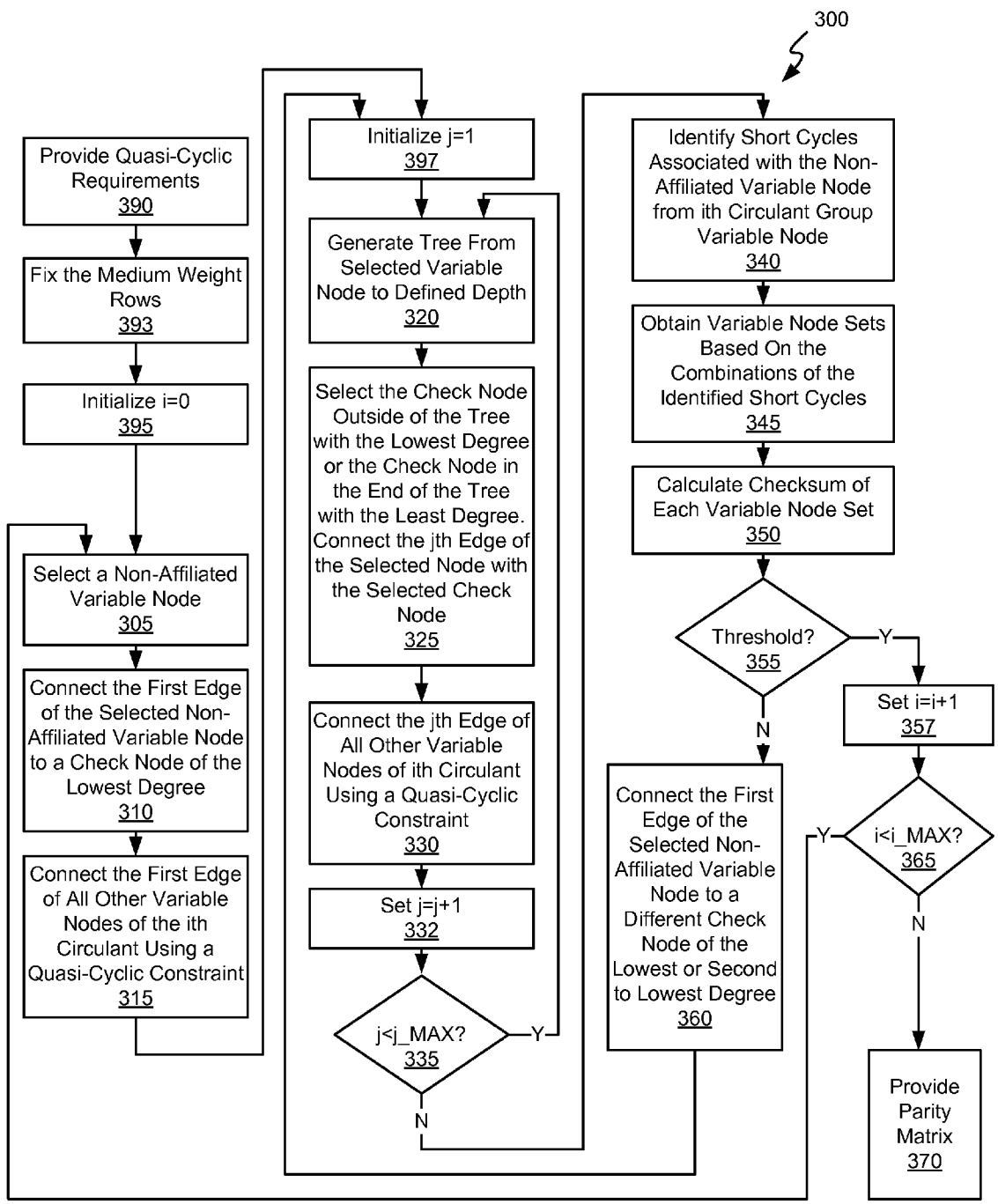
FIG. 3 is a flow diagram depicting a method in accordance with some embodiments of the present invention for quasi cyclic parity matrix construction.

The present inventions are related to systems and methods for data processing, and more particularly to LDPC based data processing.

Turning to FIG. 1, a storage system 100 including read channel circuit 110 having multiple layer check equation processing in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

As is well known in the art, a trapping set is a set of data nodes in a Tanner graph that cannot always be decoded to an original value regardless of the number iterations performed. Such sets of nodes are stable solutions to a low density parity check code (LDPC) decoding that often manifest in a cluster of interconnected nodes, such that the influence from outside these nodes is limited. Said another way, the nodes are insufficiently connected to other nodes in the graph such that a decoding failure results. During the decoding process, it is possible to get stuck in a trapping set which is not sufficiently connected to other nodes resulting in a failure in decoding.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

The decoding process performed by the read channel circuit 110 relies on an encoded data set exhibiting at least three weights—a low row weight, a medium row weight, and a high row weight. As used herein, the phrase "row weight" corresponds to the number of bits encoded by an encoding matrix included in a given row. A "low row weight" has fewer encoded bits than a "medium row weight", and a "medium row weight" has fewer encoded bits than a "high row weight". By using multiple rows with different row weights, the advantages of the different row weights can be achieved. In particular, low row weight gives strong correction on any burst error, and high row weight reducing trapping sets when compared with lower row weights. Medium row weight provides a balance between low row weights and high row weights in speeding up convergence, while mitigating burst error problems and trapping sets.

Turning to FIG. 2, a data processing system 200 relying on multiple layer quasi cyclic parity check decoding is shown in accordance with various embodiments of the present invention. Data processing system 200 includes an encoding circuit 220 that applies a generation matrix which is derived from the low density parity check matrix to an original input 205. The low density parity check matrix is a multiple layer quasi-cyclic parity check matrix. Original input 205 may be any set of input data. For example, where data processing system 200 is a hard disk drive, original input 205 may be a data set that is destined for storage on a storage medium. In such cases, a medium 240 of data processing system 200 is a storage medium. As another example, where data processing system 200 is a communication system, original input 205 may be a data set that is destined to be transferred to a receiver via a transfer medium. Such transfer mediums may be, but are not limited to, wired or wireless transfer mediums. In such cases, a medium 240 of data processing system 200 is a transfer medium. The parity check matrix is received from a block 210 that generates the multiple layer quasi-cyclic parity check matrix based upon various input constraints. Generation of the parity check matrix is discussed below in relation to FIGS. 3-5. The encoding applied by encoding circuit 220 is low density parity check encoding constrained by the generated parity check matrix as is known in the art constrained by the generated parity check matrix.

Encoding circuit 220 provides a codeword (i.e., original input encoded using the parity check matrix) 225 to a transmission circuit 230. Transmission circuit 230 may be any circuit known in the art that is capable of transferring the received codeword 225 via medium 240. Thus, for example, where data processing circuit 200 is part of a hard disk drive, transmission circuit 230 may include a read/write head assembly that converts an electrical signal into a series of magnetic signals appropriate for writing to a storage medium. Alternatively, where data processing circuit 200 is part of a wireless communication system, transmission circuit 230 may include a wireless transmitter that converts an electrical signal into a radio frequency signal appropriate for transmission via a wireless transmission medium. Transmission circuit 230 provides a transmission output 235 to medium 240. Medium 240 provides a transmitted input 245 that is transmission output 235 augmented with one or more errors introduced by the transference across medium 240.

Data processing circuit 200 includes a pre-processing circuit 250 that applies one or more analog functions to transmitted input 245. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 250 provides a pre-processed output 255 to a decoding circuit 260. Decoding circuit 260 includes a low density parity check decoder that is capable of decoding the encoded data incorporating the generated parity check matrix. Decoding circuit 260 provides a data output 265. Of note, the matrix used in encoding circuit 220 is often referred to as the generation matrix or G-matrix, and is the inverse of the parity check matrix used in decoding circuit 260 that is often referred to as the H-matrix. Both the H-matrix and G-matrix are pre-constructed using the processes described below in relation to FIGS. 3-5.

Turning to FIG. 3, a flow diagram 300 depicts a method in accordance with some embodiments of the present invention for multiple layer quasi cyclic parity matrix construction. Following flow diagram 300, a set of quasi-cyclic requirements are provided (block 390). Such quasi-cyclic requirements include identifying the number of variable nodes and check nodes to be utilized in a generated parity matrix. In addition, the variable degree, the check degree and the circulant size are indicated. The circulant size corresponds to the size of sub-matrices within the generated parity matrix that will be used. As an example, twenty-four variable nodes, sixteen check nodes, a variable degree of two, a check degree of three, and a 4×4 circulant size may be requested. Where a 4×4 circulant size is requested and the overall matrix is 24×16 (i.e., the number of variable nodes by the number of check nodes), twenty-four total circulants are included. In some embodiments of the present invention, the processes of flow diagram 300 are implemented with machine executable instructions. The machine executable instructions may be maintained on a computer readable medium that is accessible by a computer processor. The computer processor is capable of accessing the machine executable instructions from the computer readable medium, and executing the machine executable instructions to yield the generated parity check matrix. The generated parity matrix (both a G-matrix and an H-matrix) may then be provided to a data processing system where it is used in relation to both data encoding and data decoding.

In addition, the graph for the medium weight rows is defined including the number of codeword bits per row and the location of the medium weight rows within the graph (block 393). In some cases, the medium weight row is fixed as having between eighty to codeword parity bits, and corresponding low weight rows have around thirty bits per row, and the high weight rows will have about two-hundred codeword bits per row.

A circulant index counter, i, is initialized to zero (block 395). The first variable node of the $i^{th}$ circulant group that has not been previously affiliated with one or more check nodes is selected (block 305). A first edge of the selected, non-affiliated variable node is connected with a check node of the lowest degree (block 310). The check node of the lowest degree is one of the check nodes that has been affiliated with the fewest number of variable nodes. Thus, on the first pass, any of the check nodes may be selected. As the process continues, fewer and fewer of the available check nodes are capable of satisfying the lowest degree requirement. Once the selected, non-affiliated variable node is connected, the other variable nodes associated with the $i^{th}$ circulant group are also connected in accordance with a quasi-cyclic constraint (block 315). As an example, where a 3×3 circulant is used and the 1,1 position is used to connect the selected, non-affiliated variable node, the following quasi-cyclic constraint is used:

$$\begin{bmatrix} 100 \\ 010 \\ 001 \end{bmatrix}.$$

As another example, where the same 3×3 circulant is used and the 2,1 position is used to connect the selected, non-affiliated variable node, the following quasi-cyclic constraint is used:

$$\begin{bmatrix} 001 \\ 100 \\ 010 \end{bmatrix}.$$

As yet another example, where the same 3×3 circulant is used and the 2,3 position is used to connect the selected, non-affiliated variable node, the following quasi-cyclic constraint is used:

$$\begin{bmatrix} 010 \\ 001 \\ 100 \end{bmatrix}.$$

As will be noted by one of ordinary skill in the art, where the first connection is identified, the connections of the other variable nodes in the same circulant group become deterministic. In particular, where the connection in row one is in a position x, the connection in row two will be in a position x+1. Where position x+1 is greater than the number of columns, then the connection is made in the first column. It should be noted that circulants of a size other than 3×3 may be used in accordance with different embodiments of the present invention.

An edge index counter, j, is initialized to be equal to one (block 397). A tree from the selected, non-affiliated variable node is created to determine another check node to which the variable node is to be connected (block 320). The tree is built by identifying all of the connections to the selected, non-affiliated variable node. Selection of another check node is done by selecting one of the check nodes that is not included in the tree or the check node in the top of the tree with the lowest degree if there is no check node that is not included in the tree (i.e., no check node outside of the tree) (block 325). Once the selected, non-affiliated variable node is connected, the other variable nodes associated with the $i^{th}$ circulant are also connected in accordance with a quasi-cyclic constraint (block 330).

The edge index counter is incremented (block 332). It is then determined whether there are edges that remain to be connected by comparing the value of the edge index counter with a maximum count value (block 335). Where additional edges remain to be connected (block 335), the processes of blocks 320-335 are repeated for the next selected variable node. Alternatively, where no edges remain to be connected (block 335), an attempt to reduce any trapping sets is performed. In particular, short cycles associated with each check node are identified (block 340). The variable node sets associated with each of the identified short cycles are obtained (block 345), and check sums for each of the variable node sets are calculated (block 350). The checksums and the number of the variable nodes in the variable node sets are compared to a threshold value (block 355). Where the checksum and the number of the variable nodes are below the threshold value (block 355), trapping set mitigation is performed by trying a different connection (block 360). Such trapping set mitigation may include, for example, re-processing one or more connections using the processes discussed above in relation to blocks 320-335. Otherwise, when the checksum and the number of the variable nodes does not exceed the threshold value (block 355), the circulant index counter is incremented (block 357). It is then determined whether there are circulants that remain to be connected by comparing the circulant index counter value with a known maximum number of circulants (block 365). If all circulants are connected (i.e., i=i_MAX), the parity matrix is provided (block 370) for use in relation to the low density parity check decoding and encoding. Alternatively, where circulants remain to eb connected (i.e., i<i_MAX), blocks 305-355 are repeated for the variable nodes in the ith circulant.

Figure 4A:
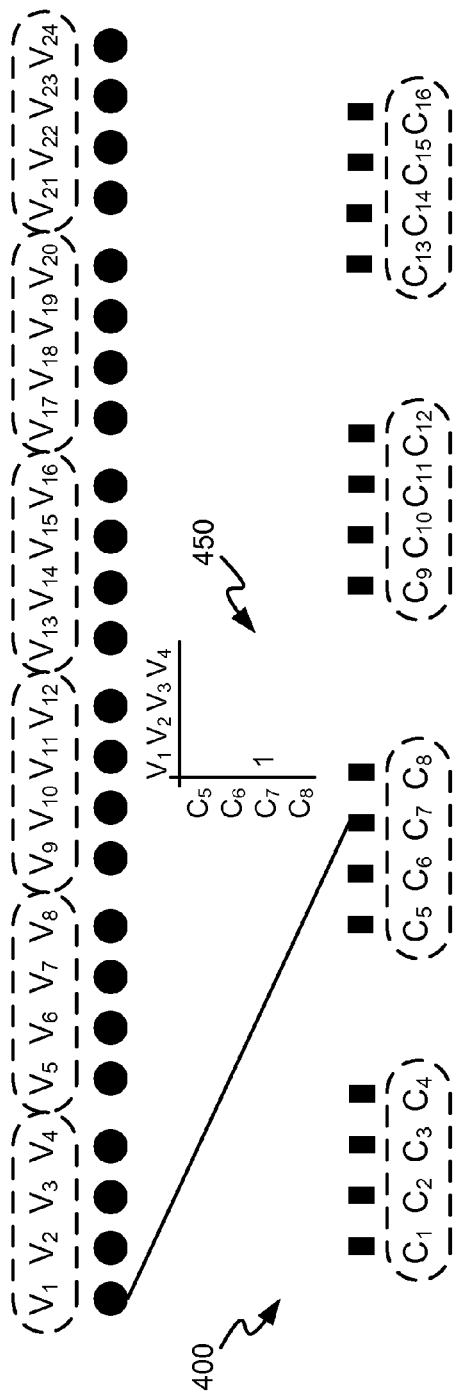
FIGS. 4*a*-4*t* show a process for quasi cyclic parity matrix construction in accordance with one or more embodiments of the present invention.
Figure 4B:
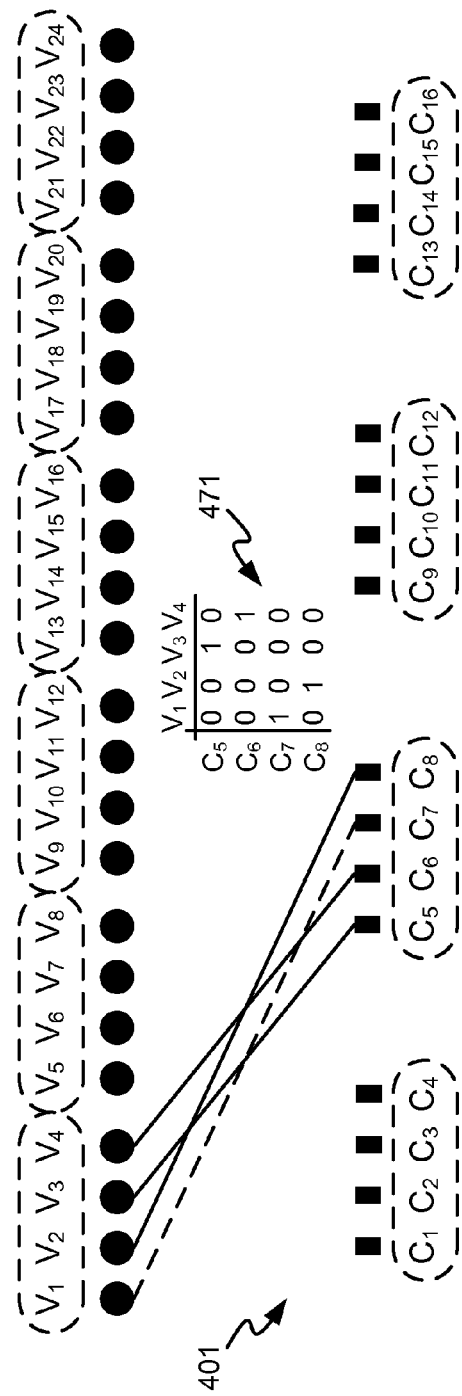
Figure 4C:
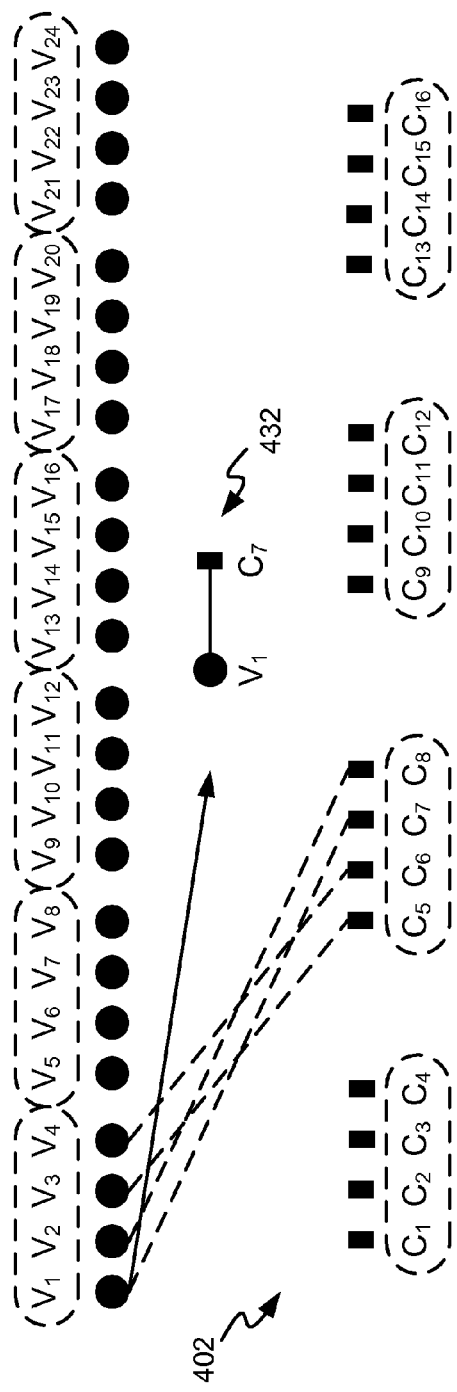
Figure 4D:
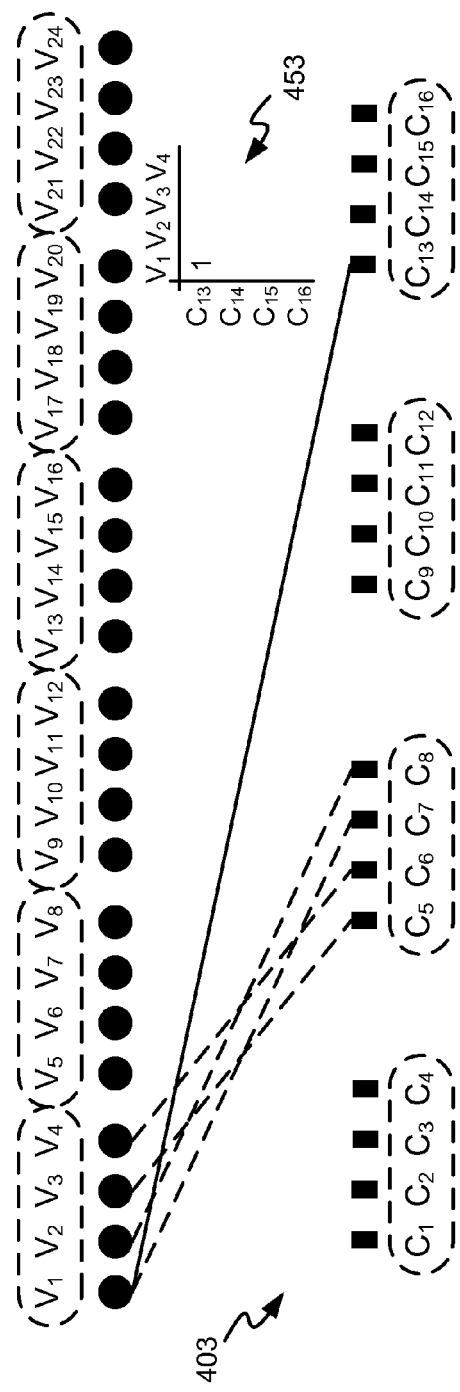
Figure 4E:
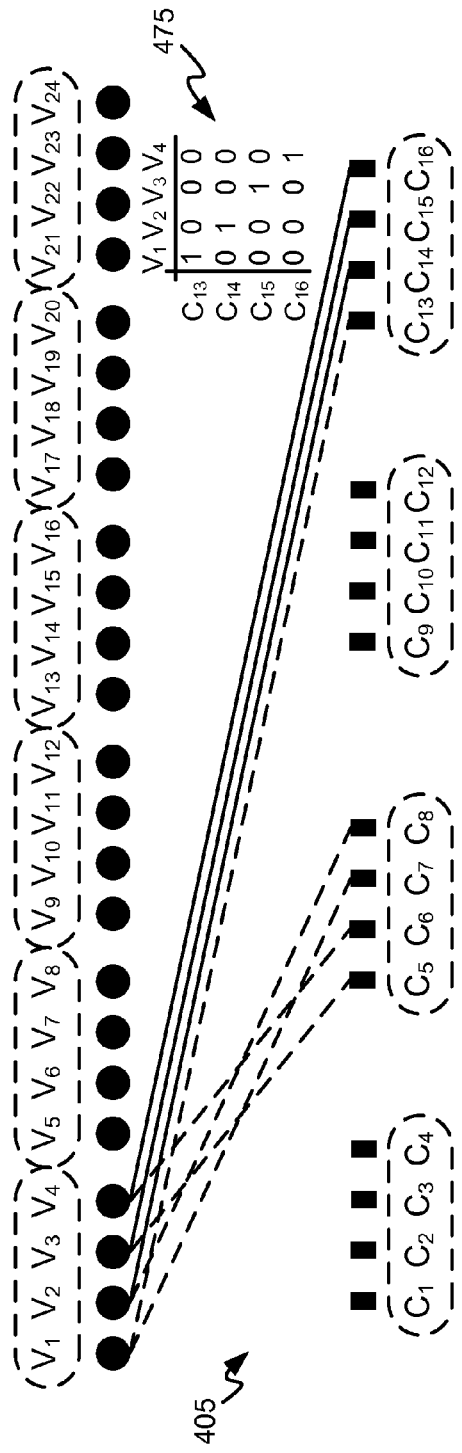
Figure 4F:
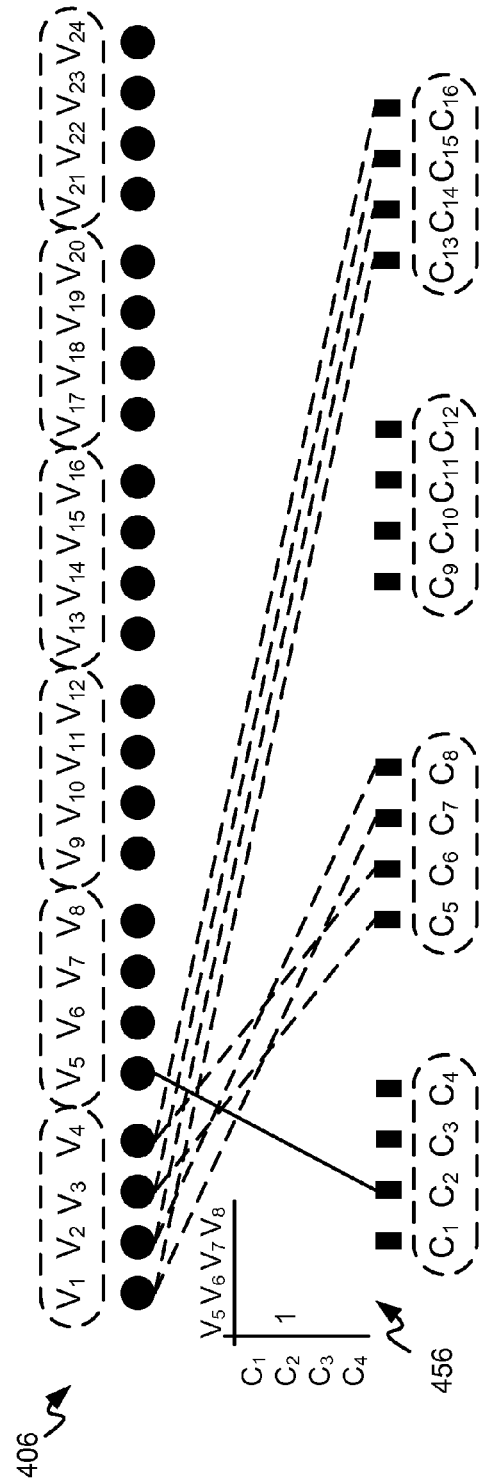
Figure 4G:
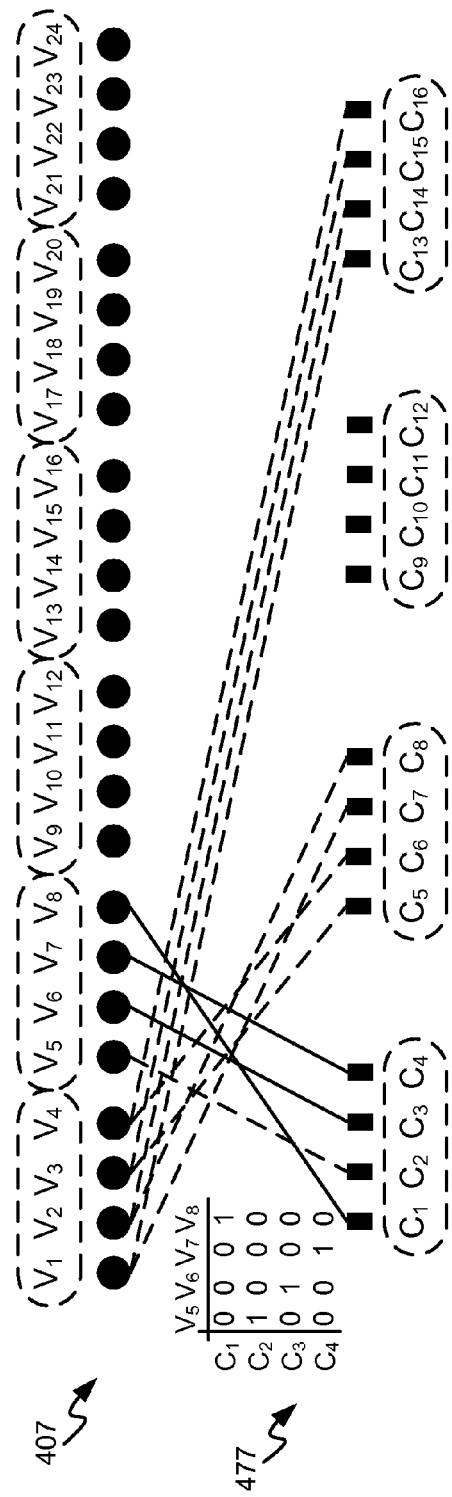
Figure 4H:
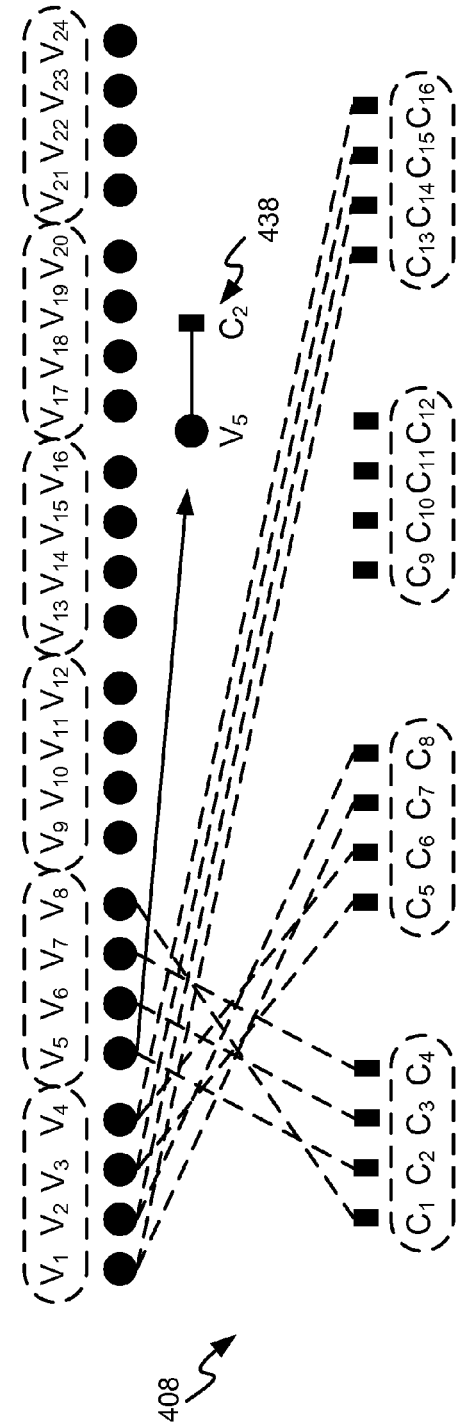
Figure 4Q:
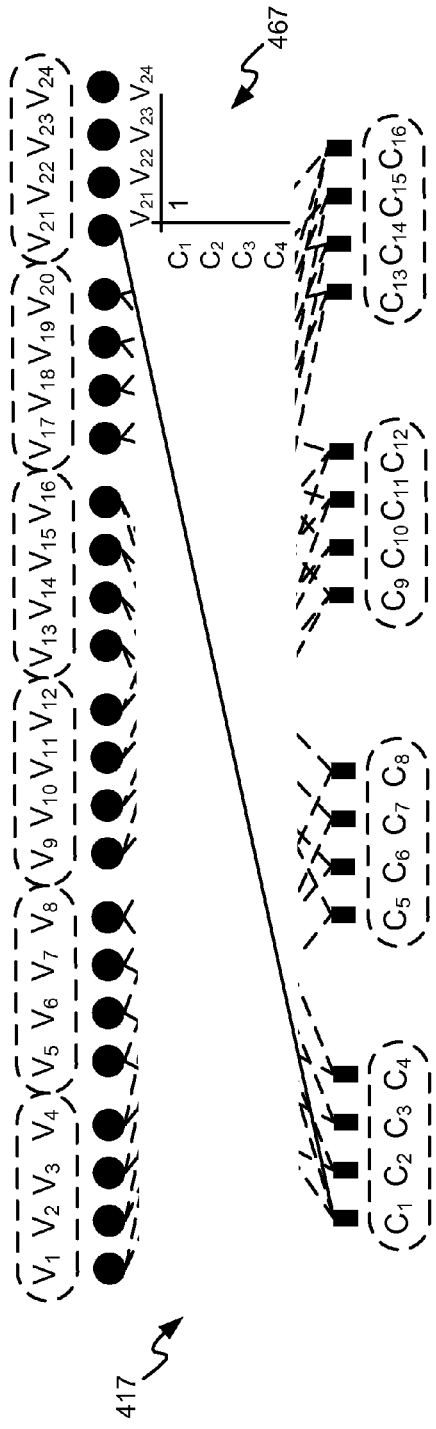
Figure 4R:
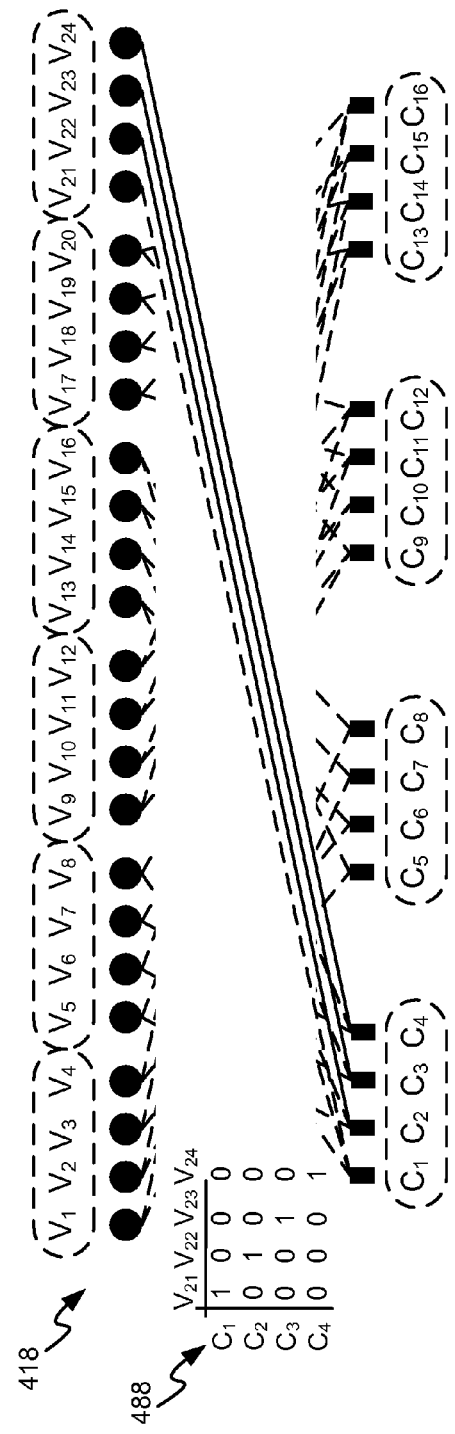
Figure 4S:
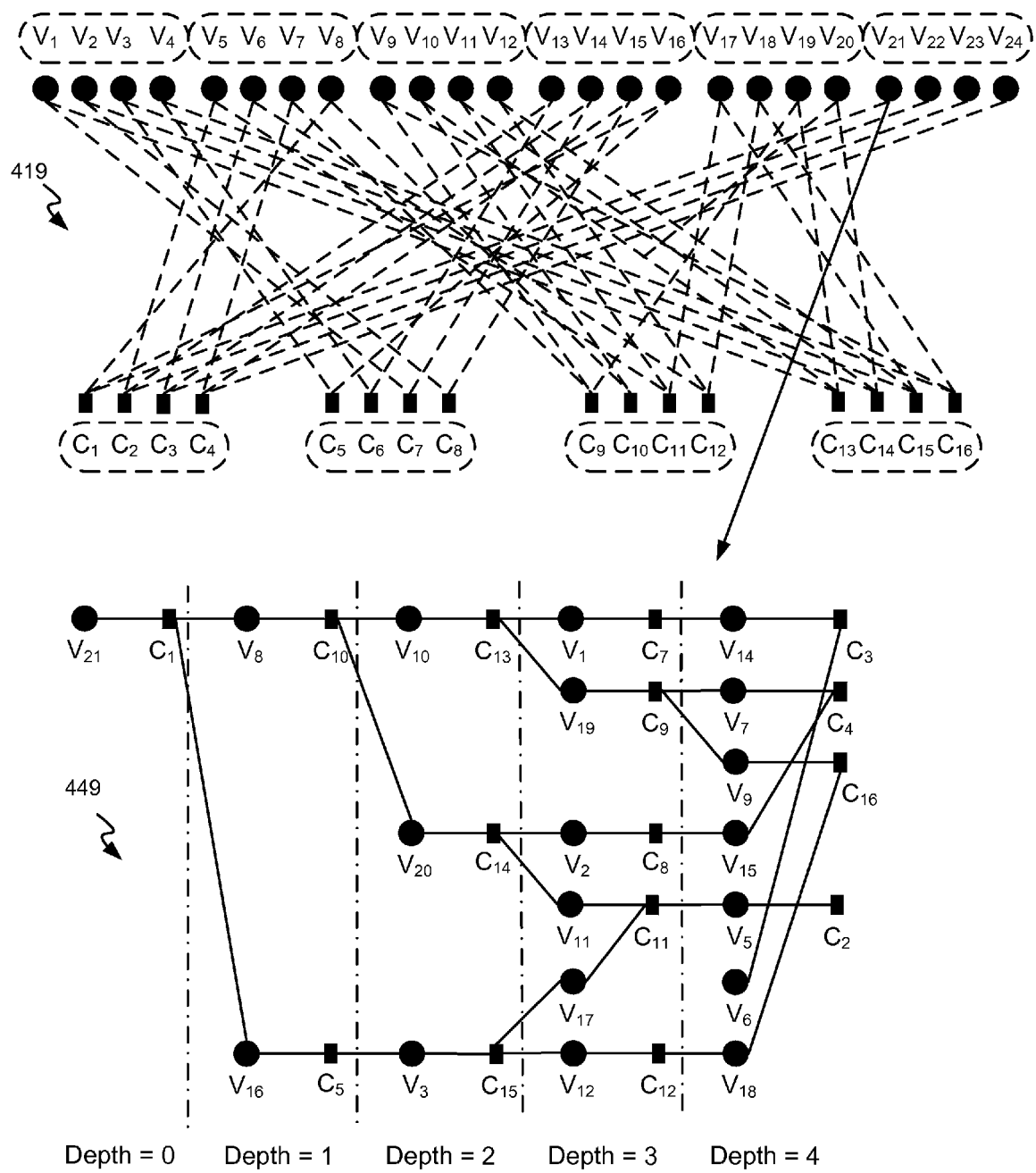
Figure 4T:
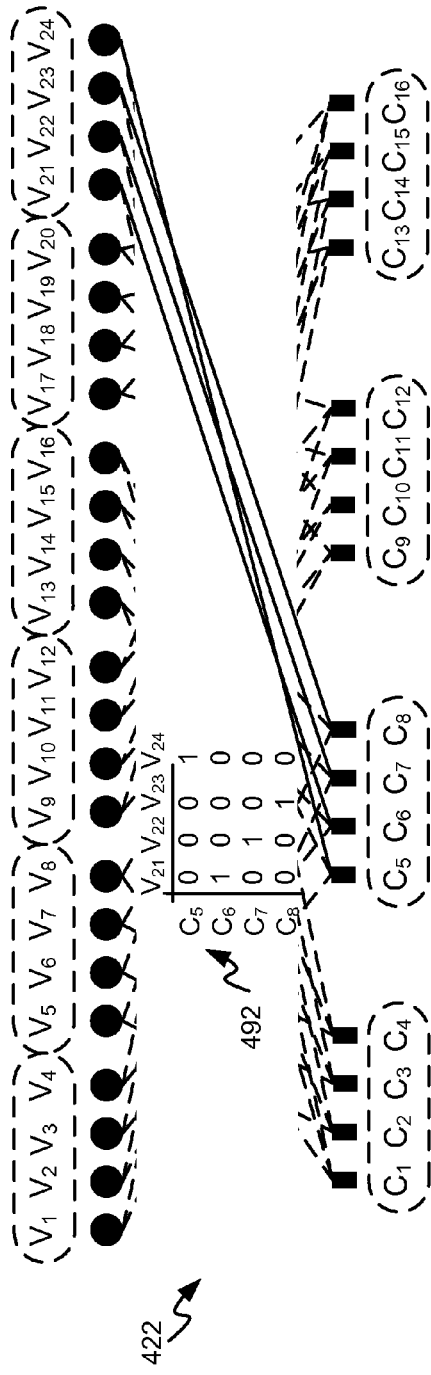

Turning to FIGS. 4a-4t an example of the processes of blocks 305-335 are performed in accordance with one or more embodiments of the present invention. The processes set forth in FIGS. 4a-4t are based upon a circulant size of 4×4, twenty-four variable nodes, sixteen check nodes, a variable degree of two, and a check degree of three. Based upon the disclosure provided herein, one of ordinary skill in the art will recognize a variety of other parameters that may be used in relation to different embodiments of the present invention. FIG. 4a is a Tanner graph 400 showing the process of block 305 and block 310 where variable node $V_1$ is selected, and a connection node with the lowest degree is selected for connection to variable node $V_1$. As shown, all of the connection nodes (i.e., $C_1$-$C_{16}$) are connected to the same number of variable nodes, and thus all have the same degree. In this case, connection node $C_7$ is selected. A partially filled matrix 450 shows the connection between $V_1$ and $C_7$ with a '1' in the connection location.

Next, turning to FIG. 4b, a Tanner graph 401 depicts the processes of block 315. In this case, matrix 450 is filled in to include the remaining connections by shifting the connection in row $C_7$ right to make row $C_8$, row $C_8$ is shifted right to make row $C_5$, and row $C_5$ is shifted right to make row $C_6$, This shifting results in a quasi-cyclic constraint 471. The connection of Tanner graph 400 are shown as a dashed line, and the other connections corresponding to quasi-cyclic constraint 471. The connection of Tanner graph 400 is shown as a dashed line, and the other connections corresponding to quasi-cyclic constraint 471 are shown as solid lines.

Next, turning to FIG. 4c, a Tanner graph 402 depicts the processes of block 320. In particular, a tree 432 is generated to determine another connection that is to be performed on variable node $V_1$. Tree 432 is generated by following all of the connections to variable node $V_1$. In this case, the only node that is connected to variable node $V_1$ is check node $C_7$. Thus, any check node other than $C_7$ may be used as the additional connection for variable node $V_1$. As shown in a Tanner graph 403 of FIG. 4d, check node $C_{13}$ is selected. A partially filled matrix 453 shows the connection between $V_1$ and $C_{13}$ with a '1' in the connection location. The connections of Tanner graph 401 are shown as dashed lines, and the other connection corresponding to partially filled matrix 453 is shown as a solid line.

Next, turning to a Tanner graph 405 of FIG. 4e, the processes of block 325 are shown including filling in matrix 453 to include the remaining connections by shifting the connection in row $C_{13}$ right to make row $C_{14}$, row $C_{14}$ is shifted right to make row $C_{15}$, and row $C_{16}$ is shifted right to make row $C_{16}$.

This shifting results in a quasi-cyclic constraint 475, and Tanner graph 405 is updated to reflect connections in accordance with quasi-cyclic constraint 475. The connections of Tanner graph 403 are shown as dashed lines, and the other connections corresponding to quasi-cyclic constraint 475 are shown as solid lines.

Other variable nodes remain to be connected (i.e., other edges remain to be connected (block 330)). Accordingly, the aforementioned processes are repeated for the remaining nodes. Turning to FIG. 4f, a Tanner graph 406 shows the process of block 305 and block 310 where variable node $V_5$ is selected, and a connection node with the lowest degree is selected for connection to variable node $V_5$. As shown, any of connection nodes $C_1$-$C_4$ and $C_9$-$C_{16}$ are connected to the same number of variable nodes, and thus all have the same degree. In this case, connection node $C_2$ is selected for connection to variable node $V_5$. A partially filled matrix 456 shows the connection between $V_5$ and $C_2$ with a '1' in the connection location. The connections of Tanner graph 405 are shown as dashed lines, and the connection of $V_5$ and $C_2$ is shown as a solid line.

Next, turning to FIG. 4g, a Tanner graph 407 depicts the processes of block 315. In this case, matrix 456 is filled in to include the remaining connections by shifting the connection in row $C_2$ right to make row $C_3$, row $C_3$ is shifted right to make row $C_4$, and row $C_4$ is shifted right to make row $C_1$. This shifting results in a quasi-cyclic constraint 477. The connections of Tanner graph 406 are shown as dashed lines, and the connection of other connections corresponding to quasi-cyclic constraint 477 are shown as solid lines.

Next, turning to FIG. 4h, a Tanner graph 408 depicts the processes of block 320. In particular, a tree 438 is generated to determine another connection that is to be performed on variable node $V_5$. Tree 438 is generated by following all of the connections to variable node $V_5$. In this case, the only node that is connected to variable node $V_5$ is check node $C_2$. Thus, any check node other than $C_2$ may be used as the additional connection for variable node $V_5$. As shown in a Tanner graph 408 of FIG. 4i, check node $C_{11}$ is selected. A partially filled matrix 459 shows the connection between $V_5$ and $C_{11}$ with a '1' in the connection location. The connections of Tanner graph 408 are shown as dashed lines, and the other connection corresponding to partially filled matrix 459 is shown as a solid line.

Next, turning to a Tanner graph 410 of FIG. 4j, the processes of block 325 are shown including filling in matrix 459 to include the remaining connections by shifting the connection in row $C_{11}$ right to make row $C_{12}$, row $C_{12}$ is shifted right to make row $C_9$, and row $C_9$ is shifted right to make row $C_{10}$. This shifting results in a quasi-cyclic constraint 480, and Tanner graph 410 is updated to reflect connections in accordance with quasi-cyclic constraint 480. The connections of Tanner graph 409 are shown as dashed lines, and the other connections corresponding to quasi-cyclic constraint 480 are shown as solid lines.

Other variable nodes remain to be connected (i.e., other edges remain to be connected (block 330)). Accordingly, the aforementioned processes are repeated for the remaining nodes. Turning to FIG. 4k, a Tanner graph 411 shows the process of block 305 and block 310 where variable node $V_9$ is selected, and a connection node with the lowest degree is selected for connection to variable node $V_9$. As shown, all connection nodes (i.e., $C_1$-$C_{16}$) are connected to the same number of variable nodes (i.e., one), and thus all have the same degree. In this case, connection node $C_9$ is selected for connection to variable node $V_9$. A partially filled matrix 461 shows the connection between $V_9$ and $C_9$ with a '1' in the connection location. The connections of Tanner graph 410 are shown as dashed lines, and the connection of $V_9$ and $C_9$ is shown as a solid line.

Next, turning to FIG. 4l, a Tanner graph 412 depicts the processes of block 315. In this case, matrix 461 is filled in to include the remaining connections by shifting the connection in row $C_9$ right to make row $C_{10}$, row $C_{10}$ is shifted right to make row $C_{11}$, and row $C_{11}$ is shifted right to make row $C_{12}$. This shifting results in a quasi-cyclic constraint 482. The connections of Tanner graph 411 are shown as dashed lines, and the connection of other connections corresponding to quasi-cyclic constraint 482 are shown as solid lines.

Next, turning to FIG. 4m, a Tanner graph 413 depicts the processes of block 320. In particular, a tree 443 is generated to determine another connection that is to be performed on variable node $V_9$. Tree 443 is generated by following all of the connections to variable node $V_9$. In this case, the only nodes that are connected to variable node $V_9$ are check node $C_9$, variable node $V_7$, and check node $C_4$. Thus, any check node other than $C_9$ or $C_4$ may be used as the additional connection for variable node $V_5$. As shown in a Tanner graph 414 of FIG. 4n, check node $C_{16}$ is selected. A partially filled matrix 464 shows the connection between $V_9$ and $C_{16}$ with a '1' in the connection location. The connections of Tanner graph 413 are shown as dashed lines, and the other connection corresponding to partially filled matrix 464 is shown as a solid line.

Next, turning to a Tanner graph 415 of FIG. 4o, the processes of block 325 are shown including filling in matrix 464 to include the remaining connections by shifting the connection in row $C_{16}$ right to make row $C_{13}$, row $C_{13}$ is shifted right to make row $C_{14}$, and row $C_{14}$ is shifted right to make row $C_{15}$. This shifting results in a quasi-cyclic constraint 485, and Tanner graph 415 is updated to reflect connections in accordance with quasi-cyclic constraint 485. The connections of Tanner graph 414 are shown as dashed lines, and the other connections corresponding to quasi-cyclic constraint 485 are shown as solid lines.

Other variable nodes remain to be connected (i.e., other edges remain to be connected (block 330)), so the processes of blocks 305-335 are further repeated to complete the graph. A Tanner graph 416 is shown in FIG. 4p where the processes of blocks 305-325 have been repeated to complete the connection of all variable nodes, except variable nodes $V_{21}$-$V_{24}$. Turning to FIG. 4q, a Tanner graph 417 is shown with the center area of the graph whited out to allow the newly added connections to be more easily seen. In this case, the processes of blocks 305-310 are repeated where the previously non-affiliated variable node $V_{21}$ is selected. A connection node with the lowest degree is selected for connection to variable node $V_{21}$. As shown, any of connection nodes $C_1$-$C_4$ and $C_5$-$C_8$ are connected to the same number of variable nodes, and thus all have the same degree. In this case, connection node $C_1$ is selected for connection to variable node $V_{21}$. A partially filled matrix 467 shows the connection between $V_{21}$ and $C_1$ with a '1' in the connection location.

Next, turning to FIG. 4r, a Tanner graph 418 depicts the processes of block 315. In this case, matrix 467 is filled in to include the remaining connections by shifting the connection in row $C_1$ right to make row $C_2$, row $C_2$ is shifted right to make row $C_3$, and row $C_3$ is shifted right to make row $C_4$. This shifting results in a quasi-cyclic constraint 488. The connections of Tanner graph 417 are shown as dashed lines, and the connection of other connections corresponding to quasi-cyclic constraint 488 are shown as solid lines.

Next, turning to FIG. 4s, a Tanner graph 419 depicts the processes of block 320. In particular, a tree 449 is generated to determine another connection that is to be performed on variable node $V_{21}$. Tree 449 is generated by following all of the connections to variable node $V_{21}$. In this case, the only node that is not connected to variable node $V_{21}$ is check node $C_6$. Thus, only check node $C_6$ can be used as the additional connection for variable node $V_{21}$. As shown in a Tanner graph 419 of FIG. 4s, check node $C_6$ is selected. Next, turning to a Tanner graph 422 of FIG. 4t, the processes of block 325 are shown resulting in a quasi-cyclic constraint 492, and Tanner graph 422 is updated to reflect connections in accordance with quasi-cyclic constraint 492. The result of the connected Tanner graph is provided as a parity check matrix that may be used for LDPC decoding and encoding.

Figure 5A:
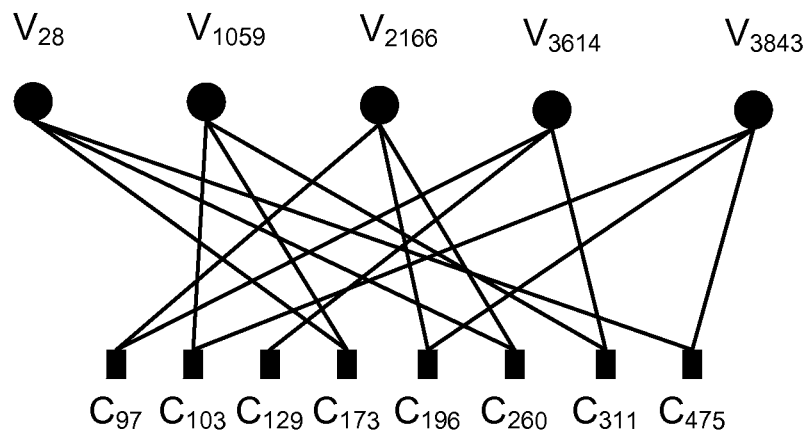
FIGS. 5*a*-5*b* show a process for trapping set mitigation in accordance with some embodiments of the present invention.
Figure 5B:
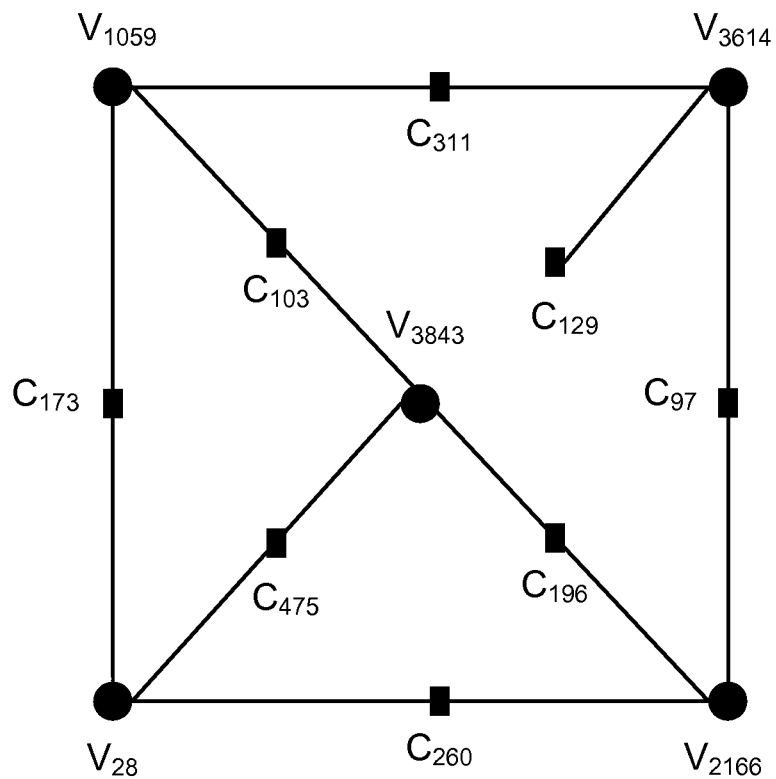

Turning to FIGS. 5a-5b an example of the processes of blocks 340-360 are performed in accordance with one or more embodiments of the present invention. Turning to FIG. 5a, an example set of connections from a portion 500 of a Tanner graph are depicted. In FIG. 5b, portion 510 is redrawn to show a number of short cycles within the Tanner graph. In some cases, a short cycle is defined as a cycle including six connections or fewer. In other cases, a short cycle is defined as including eight connections or fewer. In particular, by parsing the connections of the graphs, the following short cycles are identified (block 335):

(A) the cycle of $V_{28}$-$C_{173}$-$V_{1059}$-$C_{103}$-$V_{3843}$-$C_{475}$, that includes five connections;

(B) the cycle of $V_{28}$-$C_{173}$-$V_{1059}$-$C_{311}$-$V_{3614}$-$C_{97}$-$V_{2166}$-$C_{260}$, that includes seven connections;

(C) the cycle of $V_{28}$-$C_{173}$-$V_{1059}$-$C_{103}$-$V_{3843}$-$C_{196}$-$V_{2166}$-$C_{260}$, that includes seven connections; and (D) the cycle of $V_{1059}$-$C_{103}$-$V_{3843}$-$C_{196}$-$V_{2166}$-$C_{97}$-$V_{3614}$-$C_{311}$, that includes seven connections.

A combination of any two of the aforementioned short cycles may comprise a trapping set. The variable node sets for each of the short cycles are identified as follows (block 340):

(A) node set $\{\{V_{28}, V_{1059}, V_{3843}\}\}$;

(B) node set $\{\{V_{28}, V_{1059}, V_{3614}, V_{2166}\}\}$;

(C) node set $\{\{V_{28}, V_{1059}, V_{3843}, V_{2166}\}\}$; and (D) node set $\{\{V_{1059}, V_{3843}, V_{2166}, V_{3614}\}\}$.

A checksum for each of the aforementioned node sets is then calculated (block 345). These checksums are then compared with a programmable threshold value (block 350). Where the threshold is not met, mitigation of the trapping set is performed. This mitigation is done by re-performing one or more of the connections discussed above in relation to FIGS. 4a-4t. In particular, when connection of a variable node allows for selection of more than one check node, a check node that increases the number of connections and/or increases the checksum is selected. In this way, some dominant trapping sets may be avoided.

The aforementioned approach for trapping set optimization may be used to mitigate the effects of trapping sets by avoiding some of the more problematic trapping sets. Such an approach works very efficiently for low column weight low density parity check codes (i.e., codes with a column weight less than or equal to four). In some cases, code design using the aforementioned trapping set mitigation may be done without increases to hardware decoders or encoders, and yet produce a reduction in the error floor. This is particularly true where irregular low density parity check codes are used.

Figure 6:
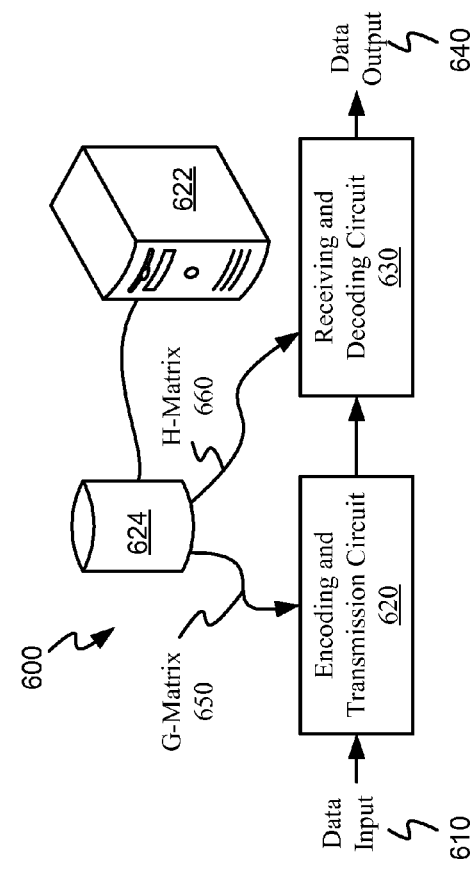
FIG. 6 depicts a data processing system in accordance with various embodiments of the present invention.

Turning to FIG. 6, a data processing system 600 is shown in accordance with various embodiments of the present invention. Data processing system 600 includes a processor 622 that is communicably coupled to a computer readable medium 624. As used herein, the phrase "computer readable medium" is used in its broadest sense to mean any medium or media capable of holding information in such a way that it is accessible by a computer processor. Thus, a computer readable medium may be, but is not limited to, a magnetic disk drive, an optical disk drive, a random access memory, a read only memory, an electrically erasable read only memory, a flash memory, or the like. Based upon the disclosure provided herein, one of ordinary skill in the art will recognize a variety of computer readable mediums and/or combinations thereof that may be used in relation to different embodiments of the present invention. Computer readable medium 624 includes instructions executed by processor 622 to produce a G-matrix 650 and a corresponding H-matrix 660 in accordance with the approach discussed above in relation to FIG. 3 and FIG. 4. G-matrix 650 is provided to an encoding and transmission circuit 620 that encodes a data input 610 using G-matrix 610 to produce a codeword. H-matrix 660 is provided to a receiving and decoding circuit 630 that decodes the codeword using H-matrix 660 to provide a data output 640.

The systems, circuits and methods discussed above in relation to FIGS. 1-6 relate to processes for encoding and decoding using matrices such that trapping sets are mitigated. FIGS. 7-11 relate to processes for developing matrices that reduce trapping sets. As an example, the processes and systems of FIGS. 7-11 may be used to implement the functionality of block 210 of FIG. 2.

Turning to FIG. 7, an LDPC code structure is shown that may be used in relation to one or more embodiments of the present invention. The depicted LDPC code structure includes an H matrix composed of an H1 matrix 700, an H2 matrix 703, and an H3 matrix 705. H1 matrix 700 is a low row weight code with regular columns. Each of the columns include a number of values ($P_{r,j}$). In some cases, the arrangement of the values ($P_{r,j}$) in H1 matrix 700 result in trapping sets. H2 matrix 703 is a medium row weight matrix. H3 matrix 705 is a high row weight matrix. H2 matrix 703 and H3 matrix 705 is added to H1 matrix 700 to create an overall H matrix. The values $P_{r,j}+R_j$ of H3 matrix 705 are selected to eliminate or reduce the trapping sets of H1 matrix 700 and H2 matrix 703. Each of the values $R_j$ are of a matrix format 710 that includes a number of values q. Each of the values q are circulants of a matrix format 715. As discussed below in relation to FIG. 8, H1 matrix 700 and H2 matrix 703 are treated together in determining and treating trapping sets.

Figure 8:
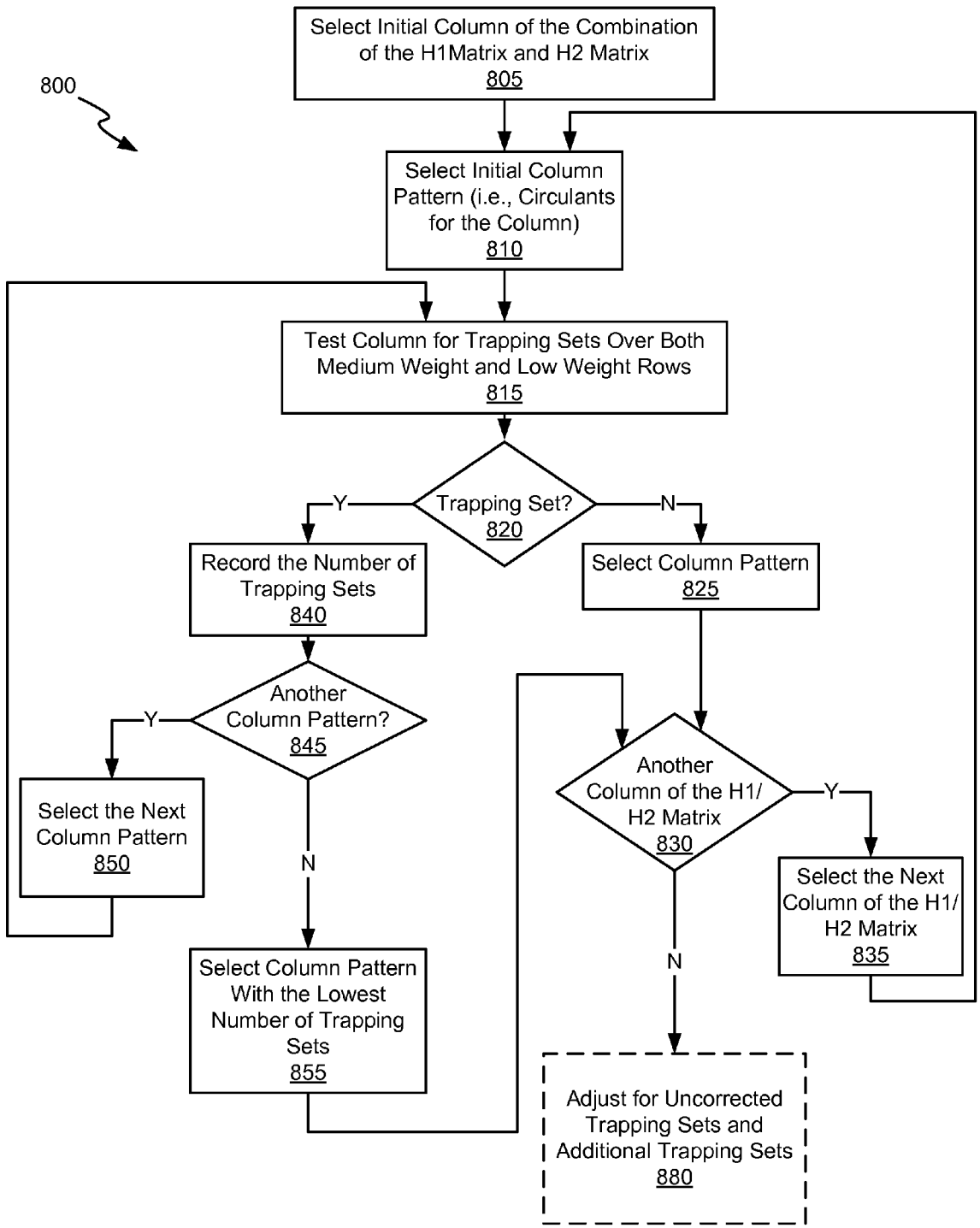
FIGS. 8-9 are flow diagrams showing a method in accordance with some embodiments of the present invention for generating an LDPC code.

Turning to FIG. 8, a flow diagram 800 shows a method in accordance with some embodiments of the present invention for generating an LDPC code. Following flow diagram 800, an initial column of a combination H1/H2 matrix is selected (block 805). This may include, for example, selecting the first column of the combination H1/H2 matrix. An initial pattern for the selected column is chosen (block 810). This includes selecting a circulant to be used for each of the values ($P_{r,j}$) in the selected column. The column is then processed to identify any potential trapping sets in the column across both the medium and low weight rows (i.e., combination H1 and H2 Matrix) (block 815). This column processing may be done using any trapping set detection methodology known in the art.

It is then determined whether any trapping sets were detected (block 820). Where no trapping sets are detected (block 820), the tested column pattern is selected for use in the combination H1 and H2 matrix (block 825). It is then determined if there is another column in the combination H1 and H2 matrix (block 830). Where there is another column of the combination H1 and H2 matrix (block 830), the next column of the combination H1 and H2 matrix is selected (block 835) and the processes of determining trapping sets for the next selected column of the H1 and H2 matrix is performed. Alternatively, where no additional columns remain to be processed (block 830), the H3 matrix is generated to reduce or mitigate the effects of any trapping sets (block 880). An example of generating the H3 matrix is discussed below in relation to FIG. 9.

Alternatively, where one or more trapping sets are identified (block 820), the number of trapping sets is recorded in relation to the selected column pattern (block 840). It is then determined whether there is another pattern for the column (block 845). This includes selecting another circulant to be used for each of the values ($P_{r,j}$) in the selected column. Where there is another pattern to be tested (block 845), the next column pattern to be tested is selected (block 850). The processes for testing the trapping sets are then performed for the newly selected column pattern. Alternatively, where no additional column patterns remain to be tested (block 845), the column pattern that yielded the lowest number of trapping sets is selected (block 855). It is then determined whether there is another column of the combination H1 and H2 matrix (block 830), the next column of the combination H1 and H2 matrix is selected (block 835) and the processes of determining trapping sets for the next selected combination H1 and H2 matrix is performed. Alternatively, where no additional columns remain to be processed (block 830), the H3 matrix is generated to reduce or mitigate the effects of any trapping sets (block 880). Again, an example of generating the H3 matrix is discussed below in relation to FIG. 9.

Figure 9:
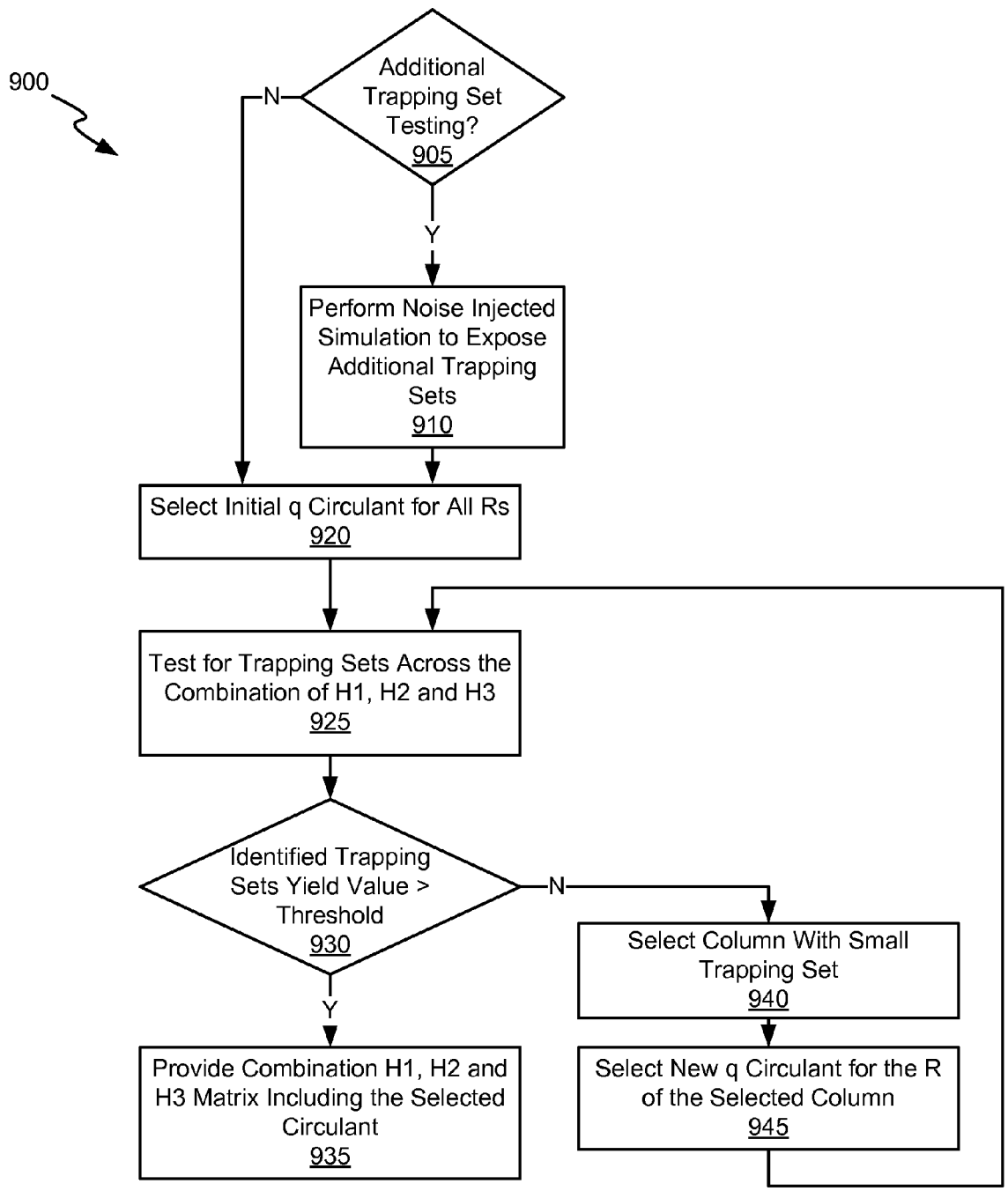

Turning to FIG. 9, a flow diagram 900 shows a method in accordance with some embodiments of the present invention for generating the H3 matrix of an LDPC code. Following flow diagram 900, it is determined whether additional trapping set testing is to be performed (block 905). Where additional trapping set testing is to be performed (block 905), a noise injected simulation is performed (block 910). Such a noise injected simulation includes processing the combination H1 and H2 matrix using a simulator where noise is added to the code built based on the combination H1 and H2 matrix. This processing may be done, for example, using the processes and systems discussed above in relation to FIGS. 1-6. Any trapping sets in addition to those previously identified in the flow diagram of FIG. 8, are added to those identified in the flow diagram of FIG. 8.

Where either additional testing is not to be performed (block 905) or the additional testing is to be completed (block 910), an initial q circulant (e.g., q 715 of FIG. 7) is selected and included for each of the values of $R_j$ in the H3 matrix (block 920). The resulting combined H1, H2 and H3 matrices (i.e., the H matrix) is tested for trapping sets (block 925). It is then determined if any of the identified trappings sets yields a value that is greater than a threshold (block 930). Where identified trapping sets are greater than the threshold (block 930), it is more easily detected. As such, the H matrix is considered complete and the combination of the H3 matrix, H2 matrix and H1 matrix including the selected circulant is provided as an output (block 935). Alternatively, where identified trapping sets are not greater than the threshold (block 930), the column of the H matrix (i.e., the combination of the H1 matrix, the H2 matrix and the H3 matrix) with the trapping set yielding the smallest value is selected (block 940). A new circulant for the R value of the selected column is selected (block 945). Using this new circulant, the process of testing for trapping sets is repeated (block 945).

Figure 10:
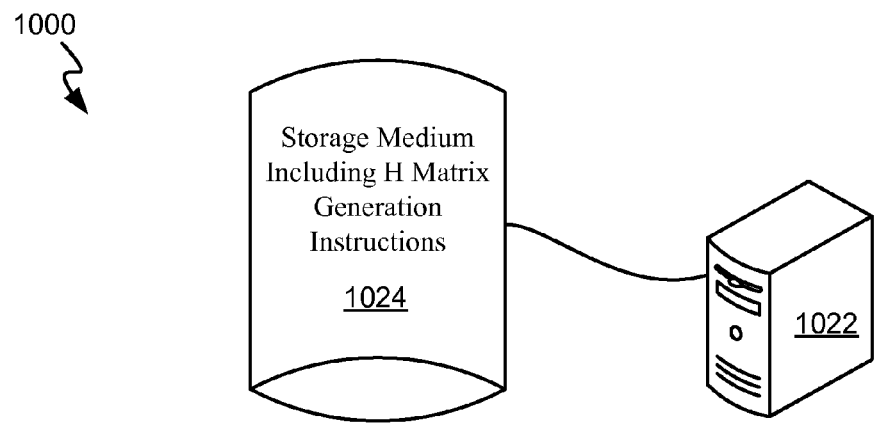
FIG. 10 depicts a code generation system in accordance with some embodiments of the present invention.

Turning to FIG. 10, a code generation system 1000 is shown in accordance with some embodiments of the present invention. Code generation system 1000 includes a computer 1022 and a computer readable medium 1024. Computer 1022 may be any processor based device known in the art. Computer readable medium 1024 may be any medium known in the art including, but not limited to, a random access memory, a hard disk drive, a tape drive, an optical storage device or any other device or combination of devices that is capable of storing data. Computer readable medium includes instructions executable by computer 1022 to generate an H matrix. Such instructions may cause the method of FIGS. 7-8 to be performed resulting in an H matrix with reduced trapping sets. In some cases, the instructions may be software instructions. Based upon the disclosure provided herein, one of ordinary skill in the art will recognize other types of instructions that may be used in relation to different embodiments of the present invention.

Figure 11:
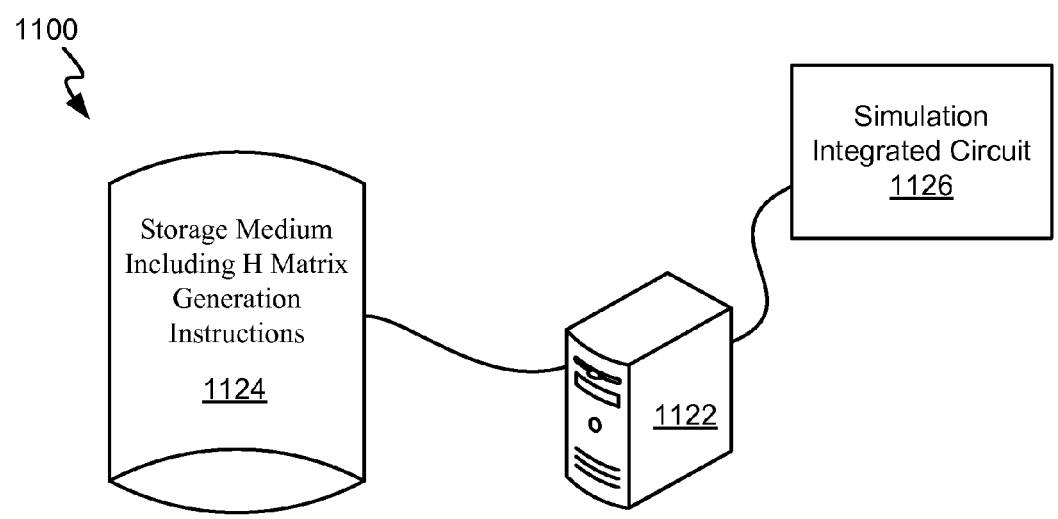
FIG. 11 depicts another code generation system in accordance with other embodiments of the present invention.

Turning to FIG. 11, another code generation system 1100 is shown in accordance with other embodiments of the present invention. Code generation system 1100 includes a computer 1122 and a computer readable medium 1124. Computer 1122 may be any processor based device known in the art. Computer readable medium 1124 may be any medium known in the art including, but not limited to, a random access memory, a hard disk drive, a tape drive, an optical storage device or any other device or combination of devices that is capable of storing data. Computer readable medium includes instructions executable by computer 1122 to generate an H matrix. Such instructions may cause the method of FIGS. 8-9 to be performed resulting in an H matrix with reduced trapping sets. In some cases, the instructions may be software instructions. Based upon the disclosure provided herein, one of ordinary skill in the art will recognize other types of instructions that may be used in relation to different embodiments of the present invention.

In addition, code generation system 1100 includes a simulation integrated circuit 1126. Simulation integration circuit 1126 may perform one or more of the processes set forth in the flow diagrams of FIGS. 8-9 that are more efficiently performed in hardware. For example, simulation integrated circuit 1126 may perform the processes of performing noise injected simulation to expose additional trapping sets. In such a case, the H1 matrix generated in software is used to encode a codeword by computer 1122, and the encoded word is provided to simulation integrated circuit 1126 where noise is added and the decoding process is performed. Simulation integrated circuit 1126 includes additional circuitry to identify and record the occurrence of additional trapping sets. As such, simulation integrated circuit 1126 includes some of the circuitry discussed above in relation to FIG. 2. It should be noted that other functions of FIGS. 8-9 may be performed by simulation integrated circuit 1126. Based upon the disclosure provided herein, one of ordinary skill in the art will appreciate a variety of distributions of work between computer 1122 executing instructions and simulation integrated circuit 1126.

In conclusion, the invention provides novel systems, devices, methods and arrangements for quasi-cyclic low density parity check data processing; and systems, devices, methods and arrangements for generating matrices with reduced trapping sets. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for generating a code format, the method comprising:
    receiving a first matrix having a row width, wherein a first row of the first matrix exhibits a low row weight;
    receiving a second matrix having the row width, wherein a second row of the second matrix exhibits a medium row weight;
    incorporating a circulant into a combination of the first matrix and the second matrix, wherein the circulant includes at least one element from the first row and at least one element from the second row;
    testing the combination of the first matrix and the second matrix for trapping sets, wherein at least one trapping set is identified;
    selecting a value to mitigate the identified trapping set; and
    augmenting the combination of the first matrix and the second matrix with a third matrix to yield a composite matrix, wherein the third matrix has the selected value, and wherein the identified trapping set is mitigated.

2. The method of claim 1, wherein the third matrix has the row width.

3. The method of claim 2, wherein the combination of the first matrix and the second matrix has a first column height, and wherein the third matrix has a second column height.

4. The method of claim 3, wherein the third column height is equal to one.

5. The method of claim 1, wherein the circulant is a first circulant, and wherein the value is a second circulant.

6. The method of claim 1, wherein testing the first column for trapping sets yields a single trapping set, wherein the circulant is a first circulant, and wherein the method further comprises:
    incorporating a second circulant into the first column of the combination of the first matrix;
    re-testing the first column for trapping sets, wherein more than one trapping sets are identified; and
    selecting the first circulant for inclusion in the first column based at least in part on the single trapping set compared with the more than one trapping set.

7. The method of claim 1, wherein testing the combination of the first matrix and the second matrix for trapping sets furthering includes testing the combination of the first matrix and the second matrix for local girth, and wherein selecting a value to mitigate the identified trapping set includes selecting shift values of current column circulants to mitigate the identified trapping set and to increase the local girth.

8. The method of claim 7, wherein the local girth is the shortest cycle in a circulant.

9. The method of claim 1, wherein selecting the value to mitigate the identified trapping set includes:
    selecting a first circulant as the value;
    testing the composite matrix for trapping sets wherein a first number of trapping sets are identified;
    selecting a second circulant as the value;
    re-testing the composite matrix for trapping sets wherein a second number of trapping sets are identified; and
    selecting one of the first circulant and the second circulant as the value based on a comparison of the first number of trapping sets and the second number of trapping sets.

10. The method of claim 1, wherein the method is at least in part performed by a processor executing instructions.

11. The method of claim 1, wherein the method is at least in part performed by an integrated circuit.

12. A system for generating a code format, the system comprising:
    a non-transitory computer readable medium, the computer readable medium including instructions executable by a processor to:
    receive a first matrix having a row width, wherein a first row of the first matrix exhibits a low row weight;

receive a second matrix having the row width, wherein a second row of the second matrix exhibits a medium row weight;

incorporate a circulant into a first column of a combination of the first matrix and the second matrix, wherein the first column includes at least one element from the first row and at least one element from the second row;

test the first column for trapping sets, wherein at least one trapping set is identified;

select a value to mitigate the identified trapping set; and augment the combination of the first matrix and the second matrix with a third matrix to yield a composite matrix, wherein the third matrix has the selected value in the first column, and wherein the identified trapping set is mitigated.

13. The system of claim 12, wherein testing the first column for trapping sets yields a single trapping set, wherein the circulant is a first circulant, and wherein the computer readable medium further includes instructions executable by a processor to:

incorporate a second circulant into the first column of the combination of the first matrix and the second matrix;

re-test the first column for trapping sets, wherein more than one trapping sets are identified; and select the first circulant for inclusion in the first column based at least in part on the single trapping set compared with the more than one trapping set.

14. The system of claim 12, wherein the instructions executable by a processor to select the value to mitigate the identified trapping set include instructions executable by the processor to:

select a first circulant as the value;

test the composite matrix for trapping sets wherein a first number of trapping sets are identified;

select a second circulant as the value;

re-test the composite matrix for trapping sets wherein a second number of trapping sets are identified; and select one of the first circulant and the second circulant as the value based on a comparison of the first number of trapping sets and the second number of trapping sets.

15. The system of claim 12, wherein the third matrix has the row width, wherein the height of a column including the first matrix and the second matrix is different from the height of a column of the third matrix.

16. The system of claim 12, wherein the circulant is a first circulant, and wherein the value is a second circulant.

17. The system of claim 12, wherein the system further comprises:

an integrated circuit operable to receive at least a portion of the combination of the first matrix and the second matrix and to test the portion for trapping sets, and wherein the instructions executable by the processor to test the first column for trapping sets includes instructions executable by the processor to provide the combination of the first matrix and the second matrix to the integrated circuit and to receive an indication of the at least one trapping set from the integrated circuit.

18. A system for generating a code format, the system comprising:

a non-transitory computer readable medium, the non-transitory computer readable medium including instructions executable by a processor;

an integrated circuit; and wherein the combination of the instructions executable by the processor and the integrated circuit are operable to:

receive a first matrix having a row width, wherein a first row of the first matrix exhibits a low row weight;

receive a second matrix having the row width, wherein a row of the second matrix exhibits a medium row weight;

incorporate a circulant into a first column of a combination of the first matrix and the second matrix, wherein the first column includes at least one element from the first row and at least one element from the second row;

test the first column for trapping sets, wherein at least one trapping set is identified;

select a value to mitigate the identified trapping set; and augment the first matrix with a third matrix to yield a composite matrix, wherein the third matrix has the selected value in the first column, and wherein the identified trapping set is mitigated.

19. The system of claim 18, wherein testing the first column for trapping sets yields a single trapping set, wherein the circulant is a first circulant, and the combination of the instructions executable by the processor and the integrated circuit are operable to:

incorporate a second circulant into the first column of the combination of the first matrix and the second matrix;

re-test the first column for trapping sets, wherein more than one trapping sets are identified; and select the first circulant for inclusion in the first column based at least in part on the single trapping set compared with the more than one trapping set.

20. The system of claim 18, wherein the combination of the instructions executable by the processor and the integrated circuit to select the value to mitigate the identified trapping set include instructions executable by the processor to:

select a first circulant as the value;

test the composite matrix for trapping sets wherein a first number of trapping sets are identified;

select a second circulant as the value;

re-test the composite matrix for trapping sets wherein a second number of trapping sets are identified; and select one of the first circulant and the second circulant as the value based on a comparison of the first number of trapping sets and the second number of trapping sets.

21. The system of claim 18, wherein the circulant is a first circulant, and wherein the value is a second circulant.

22. The system of claim 18, wherein the second matrix has the column width, wherein the row height is a first row height, and wherein the second matrix has a second row height equal to one.

* * * * *